(12) United States Patent
Vatelmacher et al.

(10) Patent No.: US 11,888,442 B2
(45) Date of Patent: Jan. 30, 2024

(54) SOLAR MODULES HAVING SOLAR SUB CELLS WITH MATRIX CONNECTIONS BETWEEN THE SOLAR SUB CELLS

(71) Applicant: SOLARWAT LTD, Even Yehuda (IL)

(72) Inventors: Boris Vatelmacher, Ganei Tikva (IL); Gabi Paz, Ganei Tikva (IL)

(73) Assignee: Solarwat Ltd, Even Yehuda (IL)

( * ) Notice: Subject to any disclaimer, the term of this patent is extended or adjusted under 35 U.S.C. 154(b) by 0 days.

(21) Appl. No.: 16/482,308

(22) PCT Filed: Jan. 31, 2018

(86) PCT No.: PCT/IL2018/050108
§ 371 (c)(1),
(2) Date: Jul. 31, 2019

(87) PCT Pub. No.: WO2018/142398
PCT Pub. Date: Aug. 9, 2018

(65) Prior Publication Data
US 2020/0007078 A1    Jan. 2, 2020

Related U.S. Application Data

(60) Provisional application No. 62/584,933, filed on Nov. 13, 2017, provisional application No. 62/452,389, filed on Jan. 31, 2017.

(51) Int. Cl.
*H02S 40/36* (2014.01)
*H02S 40/32* (2014.01)
(Continued)

(52) U.S. Cl.
CPC ............. *H02S 40/36* (2014.12); *H01L 31/05* (2013.01); *H02S 40/32* (2014.12); *H02S 50/10* (2014.12)

(58) Field of Classification Search
None
See application file for complete search history.

(56) References Cited

U.S. PATENT DOCUMENTS

2010/0186795 A1   7/2010  Gaul
2011/0270546 A1*  11/2011 Smith ................. H02S 50/10
                                          702/60
(Continued)

FOREIGN PATENT DOCUMENTS

DE   202012004526 U1   7/2012
EP       1172863 A2    1/2002
(Continued)

OTHER PUBLICATIONS

Cattaneo, Gianluca & Galliano, Federico & Chapuis, Valentin & Li, Heng-Yu & Schlumpf, Christian & Faes, Antonin & Söderström, Thomas & Yao, Yu & Grischke, Rainer & Gragert, Maria & Ballif, Christophe & Perret-Aebi, Laure-Emmanuelle. (2014). Encapsulants Characterization for Novel Photovoltaic Module Design. 10.4229/EUPVSEC20142014-1BV.6.36.
(Continued)

*Primary Examiner* — Eli S Mekhlin
(74) *Attorney, Agent, or Firm* — Polsinelli PC

(57) ABSTRACT

A solar power generation system for providing a predetermined operating power level and predetermined operating voltage level requirement is provided. The system includes at least one solar-array panel. Each of the solar-array panels includes a multiplicity of PV solar sub cells. A preconfigured number of the PV solar sub cells are electrically connected in series to form a serial-unit or each forming an individual serial unit having just one PV solar sub cell. A preconfigured number of the serial units are electrically connected in series to form a string of serial-units. The PV solar sub cells are also connected in parallel to neighboring sub cells to form a crisscross matrix array that facilitates bypassing malfunc-
(Continued)

tioning serial units, thereby improving the performance of the system. A PV solar sub cell is at least 50% smaller in area than a regular PV solar cell.

16 Claims, 29 Drawing Sheets

(51) Int. Cl.
*H02S 50/10* (2014.01)
*H01L 31/05* (2014.01)

(56) References Cited

U.S. PATENT DOCUMENTS

| | | | |
|---|---|---|---|
| 2012/0313440 A1 | 12/2012 | Watelmacher | |
| 2013/0284233 A1 | 10/2013 | Kataoka et al. | |
| 2014/0001864 A1* | 1/2014 | Nirantare | H02J 1/10 307/71 |
| 2014/0166066 A1 | 6/2014 | Hennessy et al. | |
| 2015/0162458 A1* | 6/2015 | Vatelmacher | H01L 31/02021 307/77 |
| 2016/0141435 A1 | 5/2016 | Sridhara et al. | |
| 2016/0172510 A1 | 6/2016 | Bitnar | |

FOREIGN PATENT DOCUMENTS

| | | | |
|---|---|---|---|
| GB | 2515837 A | 1/2015 | |
| JP | 2010-512139 A | 4/2010 | |
| JP | 2011-200096 A | 10/2011 | |
| JP | 2012-169581 A | 9/2012 | |
| JP | 2013-38826 A | 2/2013 | |
| JP | 2013-518403 A | 5/2013 | |
| JP | 2013-152687 A | 8/2013 | |
| JP | 2013-196338 A | 9/2013 | |
| JP | 2016-63212 A | 4/2016 | |
| WO | 2010029884 A1 | 3/2010 | |
| WO | 2011089607 A1 | 7/2011 | |
| WO | WO-2011089607 A1 * | 7/2011 | ........... H01L 31/042 |
| WO | 2013144963 A1 | 3/2013 | |
| WO | 2014008313 A3 | 1/2014 | |
| WO | 2018142398 A1 | 8/2018 | |

OTHER PUBLICATIONS

English translation of DE202012004526 retrieved from www.espacenet.com.
English translation of WO2010029884 retrieved from www.espacenet.com.
International Search Report; PCT Application No. PCT/IL2018/050108; dated May 14, 2018.
Written Opinion of PCT Application No. PCT/IL2018/050108; dated May 14, 2018.
English Language Abstract of WO2010029884; Retreived From www.espacenet.com on Jul. 29, 2019.
Japanese Office Action for Japanese application No. JP 2019-540074, dated Dec. 7, 2021, 12 pages (English Translation).
English translation of JP 2011200096 retrieved from www.espacenet.com.
English translation of JP 2016063212 retrieved from www.espacenet.com.
English translation of JP 2012169581 retrieved from www.espacenet.com.
English translation of JP 2013196338 retrieved from www.espacenet.com.
English translation of JP 2013038826 retrieved from www.espacenet.com.
English translation of JP 2010512139 retrieved from www.espacenet.com.
English translation of JP 2013518403 retrieved from www.espacenet.com.
English translation of JP 2013152687 retrieved from www.espacenet.com.

* cited by examiner

SOLAR MODULES HAVING SOLAR SUB CELLS WITH MATRIX CONNECTIONS BETWEEN THE SOLAR SUB CELLS

CROSS-REFERENCE TO RELATED APPLICATIONS

This application is a national stage entry of PCT/IL2018/050108 filed Jan. 31, 2018, which claims convention priority from U.S. provisional patent application 62/452,389 filed on Jan. 31, 2017 and U.S. provisional patent application 62/584,933 filed on Nov. 13, 2017, the contents each of which are hereby incorporated by reference in their entirety.

FIELD OF THE INVENTION

The present invention relates to a solar array module system for generating electric-power and more particularly, to a non-monolithic solar array module system having PV solar sub cells interconnected in a crisscross configuration.

BACKGROUND OF THE INVENTION

Non-monolithic photovoltaic (PV) cells that are subdivided into smaller sub cells that are interconnected in series, are known in the art.

Solar array modules, having solar cells that are interconnected in a crisscross electrical matrix are also known in the art. See, for example, PCT Published Application No. WO/2011/089607 ('607) filed on Jan. 23, 2011, and PCT Published Application No. WO/2013/144963 ('963) filed on Mar. 30, 2013, by the same inventor as the instant application and which is owned in common, which are hereby incorporated by reference in their entirety.

The electrical current generated in a PV cell brings about losses of power caused by:
1. The busbar of each solar cell.
2. The solder points between PV cells and external conductors and other soldered points.
3. Conductors interconnecting PV cells into string of cells.
4. Conductors connecting string of PV cells to respective junction boxes.

These overall power losses decrease the output power of a PV panel.

A typical non-monolithic PV panel consists of dozens of quadratic PV cells. A typical quadratic cell size is approximately 15 cm×15 cm and provides electrical power of around (all numbers are given by way of example only, with no limitations):

$$0.5V*8A=4\ W$$

With reference to the drawings, FIG. 1., showing the equivalent circuit 20 of a PV cell, it is evident that the current I (80) produced by the solar cell is equal to that produced by the current source 70, minus that which flows through the diode 30, minus that which flows through the shunt resistor 40:

$$I=I_L-I_D-I_{SH}$$

where
- I (80)=output current (ampere)
- $I_L$ (82) photo-generated current (ampere)
- $I_D$ (84)=diode current (ampere)
- $I_{SH}$ (86)=shunt current (ampere).
- $R_S$ (50)<<$R_{SH}$(40)

The values of $I_L$, $I_D$, $R_S$ and $R_{SH}$ are dependent upon the physical size of the solar cell. When comparing otherwise identical technology solar cells, a first cell with twice the junction (light sensitive) area of a second cell generates double the $I_L$ and I 80 is also approximately twice higher. Regardless of the PV cell size, the cell output voltage 60 remains almost unchanged.

For example, if instead of a regular 15 cm×15 cm (proximal dimensions) quadratic cell, herein after also referred to as "regular size solar cell", "regular PV solar cell", "regular solar cell", or "regular cell", two cells of size 15 cm×7.5 cm, or three cells of size 15 cm×5 cm each are used (or other smaller (sub) sizes of cells that combine into a total of 15 cm×15 cm area, thereby the power of the regular 15 cm×15 cm quadratic cell and the sum of the combined sub cells' power are equivalent (not considering smaller power losses and improved fill-factor of sub-cells, because actually, they provides higher power yield), then: the smaller size cell of 15 cm×7.5 cm produces a voltage of around 0.5V, but provides half the magnitude of current of the big cell (15 cm*15 cm), i.e., I=8 A/2=4 A.

Similarly, a sub cell of 15 cm×5 cm provides a current I=8 A/3=2.66 A. Therefore, the power losses caused by the three times smaller size solar cell output current on the same soldering points of cells, same busbars on solar cells, same conductors interconnecting PV cells to strings of cells, same conductors connecting strings of PV cells to designated junction boxes, according to the following expression, will be significantly less than the power losses brought about by larger output current of the bigger size cell:

$$P_{losses}=I^2R,$$

where R is total resistance of all of the above conductors and soldered points.

The table below compares, by way of example, the power losses in 250 W panel with big and small PV cells sizes:

| PV cell size | I (A) | Total power losses (W) according paragraph 1 | Amount of power losses (W) saved |
|---|---|---|---|
| 156 mm X 156 mm | 8 | 11 | 9 |
| 156 mm X 52 mm | 2.66 | 2 | |

Incorporating smaller size cells with cells matrix connection maintains all advantages of this type of cells connection and provide higher power yield from each cell and from the entire panel.

There is therefore a need and it would be advantageous to have solar array modules for producing electric-power, having solar cells that are interconnected in a crisscross electrical matrix, wherein at least some of the regular size solar cells are "replaced" by a number of equivalent sub cells, and it would be further advantageous to have at least some of the sub cells interconnected in matrix, crisscross configuration. Typically, with no limitation, a regular size solar cell is cut into the number of equivalent sub cells.

SUMMARY OF THE INVENTION

A principal intention of the present invention is to provide a non-monolithic array of solar cells that are interconnected in a crisscross electrical matrix, wherein at least some of the regular size solar cells are replaced by a number of sub cells that provide the same voltage, and wherein the smaller the solar cells are the less power losses are inflicted. The crisscross electrical matrix provides a passive rerouting of electric current when an individual solar-cell malfunctions. The solar module includes solar cells that are interconnected in a crisscross electrical matrix, wherein at least some of the "regular" size solar cells (15 cm×15 cm) are, for example, replaced by cutting such a regular size solar cell into a number of equivalent sub cells, and wherein the sub cells are interconnected in matrix, crisscross configuration.

Let us presume, for example, with no limitations, a common panel having 60 regular (15 cm×15 cm) PV solar cells 210, that is arranged in a crisscross matrix configuration of 10 columns with serial strings each consisting of 6 regular PV solar cells. Each serial string of cells 210 provides power of: 8 A*(0.5V*6)=24 W. Hence, the voltage of a serial string of regular cells 210 is: 0.5V*6=3V, and the panel provides a total of 240 W. It should be noted that a 3V panel voltage is not suitable to obtain the voltage of commonly used regular panels, and requires an additional voltage DC/DC converter 250 (see FIG. 3) to boost the panel output voltage. If each regular PV solar cells 210 is replaced by a string of 9 sub cells, connected in serial, each typically of size 15 cm×1.67 cm, then the current I drops to 8/9=0.8889 A, but the voltage of serial string of sub cells is now: 0.5V*6*9=27V. Therefore, the total output power remains 240 W. In such a case, no DC/DC converter 250 is needed and it is possible to connect all panels with crisscross matrix cells connections, with or without a Maximum Power Point Tracker (being a power optimizer), directly in series to create strings of panels, to connect strings in parallel and to connect directly to an inverter or create parallel connections of a lot of the above panels with suitable panels output voltage and connect this array to battery charger with or without a MPPT.

The advantages of multiple sub cells arranged in a crisscross matrix include:
a. No DC/DC converter 250 is needed, thereby reducing the panel cost.
b. Lack of need to use voltage converter enables to increase the panel energy by about 3% (in case of a 97% efficiency of converter).
c. The smaller current of the PV cells further reduces power losses.

It should be noted that orientation related descriptions such as "top", "bottom", "horizontal", "vertical" up", "upper", "down", "low", "lower" and the like, assumes that the solar cell module is situated, with no limitations, such that the positive ("+") side of the array is considered, artificially, with no limitations, as the top side of the array, and the negative ("−") side of the array is considered, artificially, with no limitations, as the bottom side of the array. Alternatively, with no limitations, the negative ("−") side of the array is considered, artificially, with no limitations, as the top side of the array, and the positive ("+") side of the array is considered, artificially, with no limitations, as the bottom side of the array.

It should be further noted that the terms "electrical" or "electrically wired", as used herein refer to the electrical configuration of the matrix, regardless of the physical configuration of the solar cells in the solar panel. Similarly, it should be further noted that the term "physical" as used herein refers to the physical placement of solar cells in the module/panel, regardless of the electrical inter-wiring of the solar cells.

According to the teachings of the present invention there is provided a solar power generation system for providing a predetermined operating power level and predetermined operating voltage level requirement, the system including at least one solar-array panel, wherein each of the at least one solar-array panels includes a multiplicity of PV solar sub cells, wherein a preconfigured number of the PV solar sub cells are electrically connected in series to form a serial-unit or each individual serial unit having just one PV solar sub cell, and wherein a preconfigured number of the serial units are electrically connected in series to form a string of serial-units, the string of serial-units is facilitated to produce a first output voltage level.

A preconfigured number of the strings of serial-units, are electrically connected in parallel to form an array of the PV solar sub cells. In each of the strings of serial-units, each of the serial-units is also connected in parallel to the neighboring serial-units of all other strings of serial-units, to form a crisscross matrix array of the serial units, the crisscross matrix array of the PV solar sub cells is facilitated to produce a first output power level, wherein the crisscross matrix array of the serial units allows currents to bypass malfunctioning serial units, thereby improving the performance of the system; and Each of the PV solar sub cell is physically smaller than a regular PV solar cell, wherein a regular PV solar cell is a quadrangular of about 15 cm×15 cm and produces a voltage of about 0.5V and current of about 8 A, and wherein the PV solar sub cell is a quadrangular PV solar cell that is at least 50% smaller in area than a regular PV solar cell.

It should be noted that the voltage produced by a regular PV solar cell and by a combination of the PV solar sub cell, covering an equivalent PV area, is the same, but the current generated by the combination of the PV solar sub cell is directly proportionately smaller than the current generated by a regular PV solar cell, thereby minimizing power loses and eliminating the need for a DC/DC converter.

Optionally, each of the strings of serial-units consists of the same number of the solar cells electrically connected in series.

Optionally, the solar power generation system further including a quantity of f bypass diodes that are connected in parallel to a preconfigured number of rows of the sub cells of the matrix array of the solar-array panel.

Optionally, the sub cells are formed by cutting regular PV solar cell.

Optionally, the multiple solar-array panels are connected in parallel and coupled to operate with a panel DC/AC inverter, to invert the DC output voltage of aid solar-array panels to AC voltage.

Optionally, the array parallelly connected solar-array panels are further connected in serial with a battery charger. Preferably, the battery charger is coupled to operate with a maximum power point tracker (MPPT) optimizer, and wherein the multiple solar-array panels are connected in parallel.

Optionally, the multiple solar-array panels are serially connected to form a string of solar-array panels, wherein the multiple strings of solar-array panels are connected in parallel, and wherein the array of multiple strings of solar-array panels are connected in parallel is further serially connected with a DC to AC inverter.

Optionally, the DC output of the matrix array of the PV solar sub cells is regulated by a MPPT optimizer, to provide maximum yield of power from the solar matrix array panel of the system. Optionally, a communication unit facilitates communication between the MPPT optimizer and a remote computerized unit.

Optionally, each of the string of solar-array panels is serially connected with a DC to AC inverter, before being parallelly interconnected.

Optionally, the DC output of the matrix array is serially connected to an inverter that inverts the DC voltage to AC voltage.

Optionally, the solar power generation system further includes a MPPT optimizer, an input/output voltage/current measurement unit and a power-calculation-processor, wherein the maximum power point (MPP) of the crisscross matrix of sub solar cells is regulated by the MPPT optimizer, based on the voltage/current measurements obtained by the measurement unit and analyzed by the power-calculation-processor. Optionally, the solar power generation system further includes a central monitoring and control sub system having a central processor, wherein the matrix array panel further includes a transmitter and a receiver, wherein the transmitter is configured to transferring the measurement data obtained from input/output voltage/current meter to a central processor; wherein the receiver is configured to receive commands from the central processor; and wherein the power-calculation-processor is configured to provide the MPPT optimizer with regulation data to thereby regulate the MPP of the crisscross matrix of sub solar cells.

Optionally, the central processor is further configured to send and/or receive data to and/or from a remote processor.

Optionally, the remote processor is selected from a group including a remote computer and a smart mobile device.

Optionally, the data is selected from a group including panel energy, power, temperature, voltage, current, time and date, a disable command and an enable command.

Optionally, the multiple solar-array panels that are MPP regulated, are serially connected to form a string of solar-array panels, and wherein the multiple strings of solar-array panels are connected in parallel.

Optionally, the multiple solar-array panels, that are MPP regulated, connected in parallel. Optionally, each of the solar-array panels is serially connected in series with a DC to AC inverter, before being interconnected in parallel.

Optionally, each of the solar-array panels is serially connected with a DC to AC inverter, and wherein the solar-array panels are connected in parallel before being serially connected with the DC to AC inverter and after being serially connected with the DC to AC inverter. Optionally, the parallel connection of the solar-array panels, before being serially connected with the DC to AC inverter, is switchable.

Optionally, the solar power generation system further includes a central monitoring and control sub system having a central processor, wherein each of the matrix array panel further includes a processor, output/input voltage/current measurement, transmitter and a receiver, wherein the transmitter is configured to transferring the measurement data obtained from input/output voltage/current meter to a central processor; wherein the receiver is configured to receive commands from the central processor; and wherein the power-calculation-processor is configured to provide the MPPT optimizer with regulation data to thereby regulate the MPP of the crisscross matrix of sub solar cells of the matrix array panels.

Optionally, the DC output of the matrix array is connected to a DC/DC power converter.

Optionally, the DC output of the matrix array is connected to multiple DC/DC power converters.

Optionally, the DC output of each of the strings of serial-units of the matrix array is serially connected to a DC/DC power converter, and wherein the parallelly connected DC/DC power converters are serially connected to a MPPT.

Optionally, the DC output of each of the strings of serial-units of the matrix array is serially connected to a DC/DC power converter, wherein each the DC/DC power converters is serially connected to a respective MPPT.

BRIEF DESCRIPTION OF THE DRAWINGS

The present invention will become fully understood from the detailed description given herein below and the accompanying drawings, which are given by way of illustration and example only, and thus not limiting in any way, wherein.

DETAILED DESCRIPTION OF THE INVENTION

The present invention now will be described more fully hereinafter with reference to the accompanying drawings, in which preferred embodiments of the invention are shown.

Figure 1:
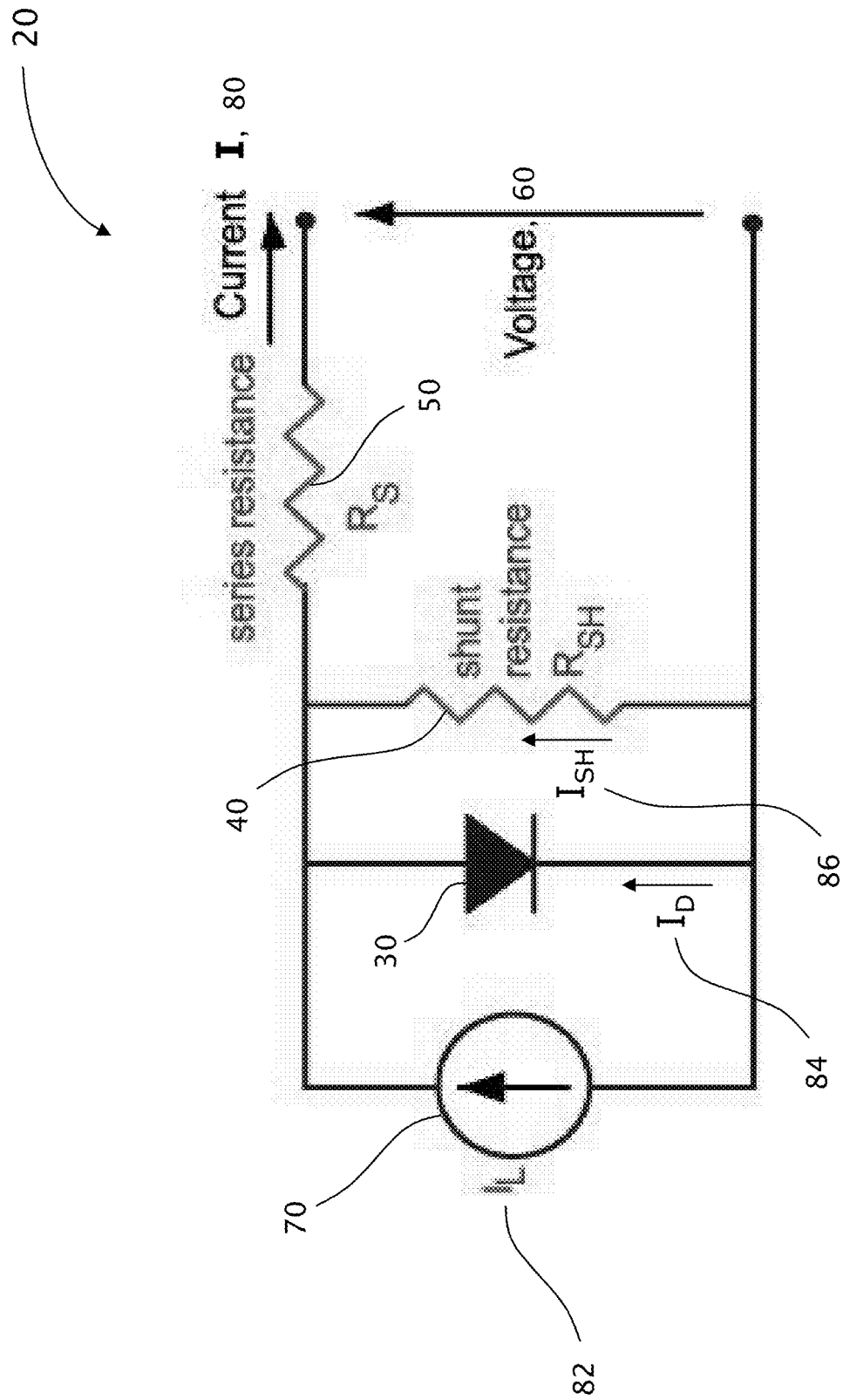
FIG. 1 (prior art) is a schematic illustration of the equivalent electrical circuit of a PV cell.
Figure 2:
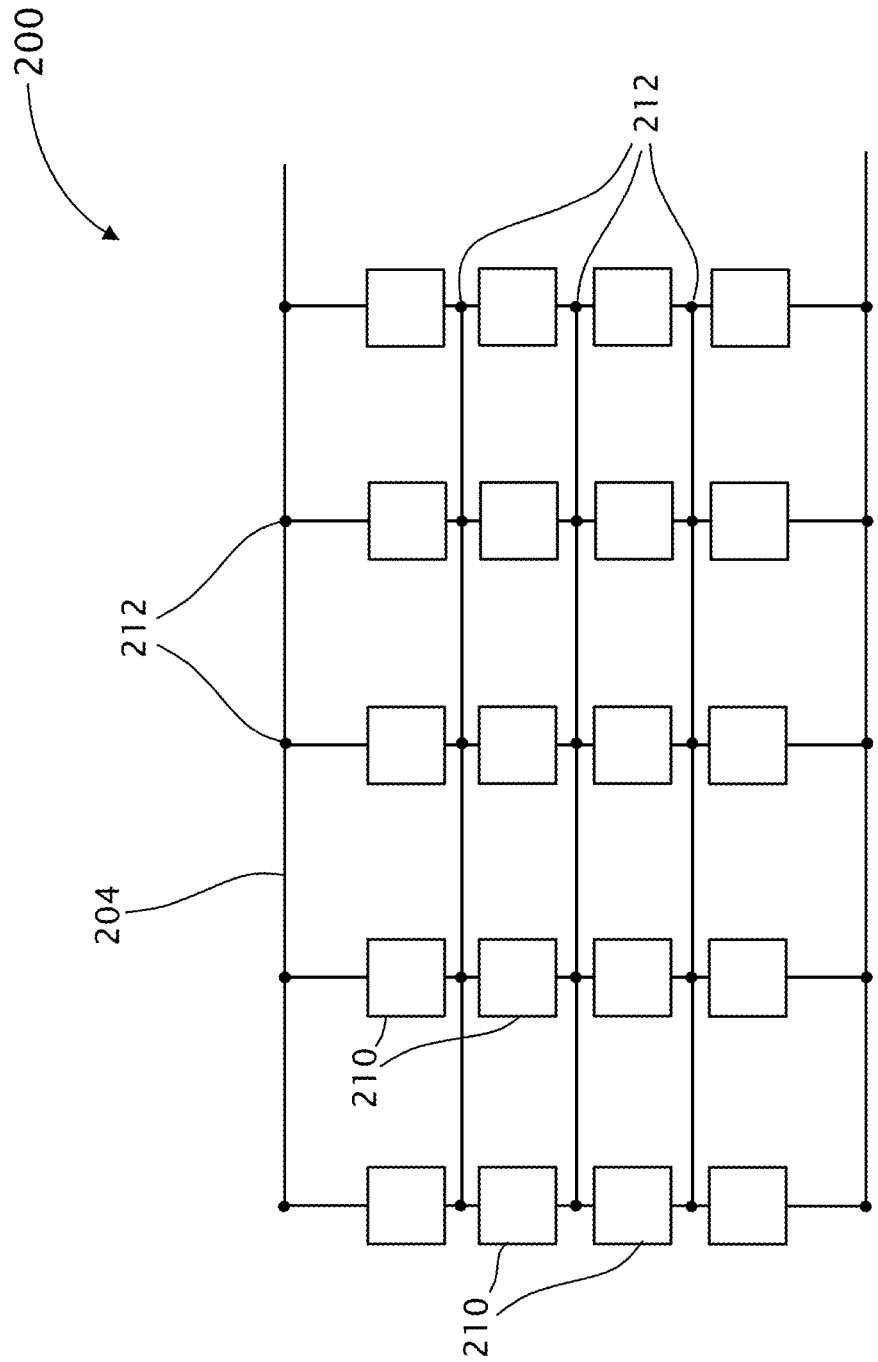
FIG. 2 (prior art) is a schematic illustration of a solar cell matrix having regular PV solar cells interconnected in a crisscross configuration.
Figure 3:
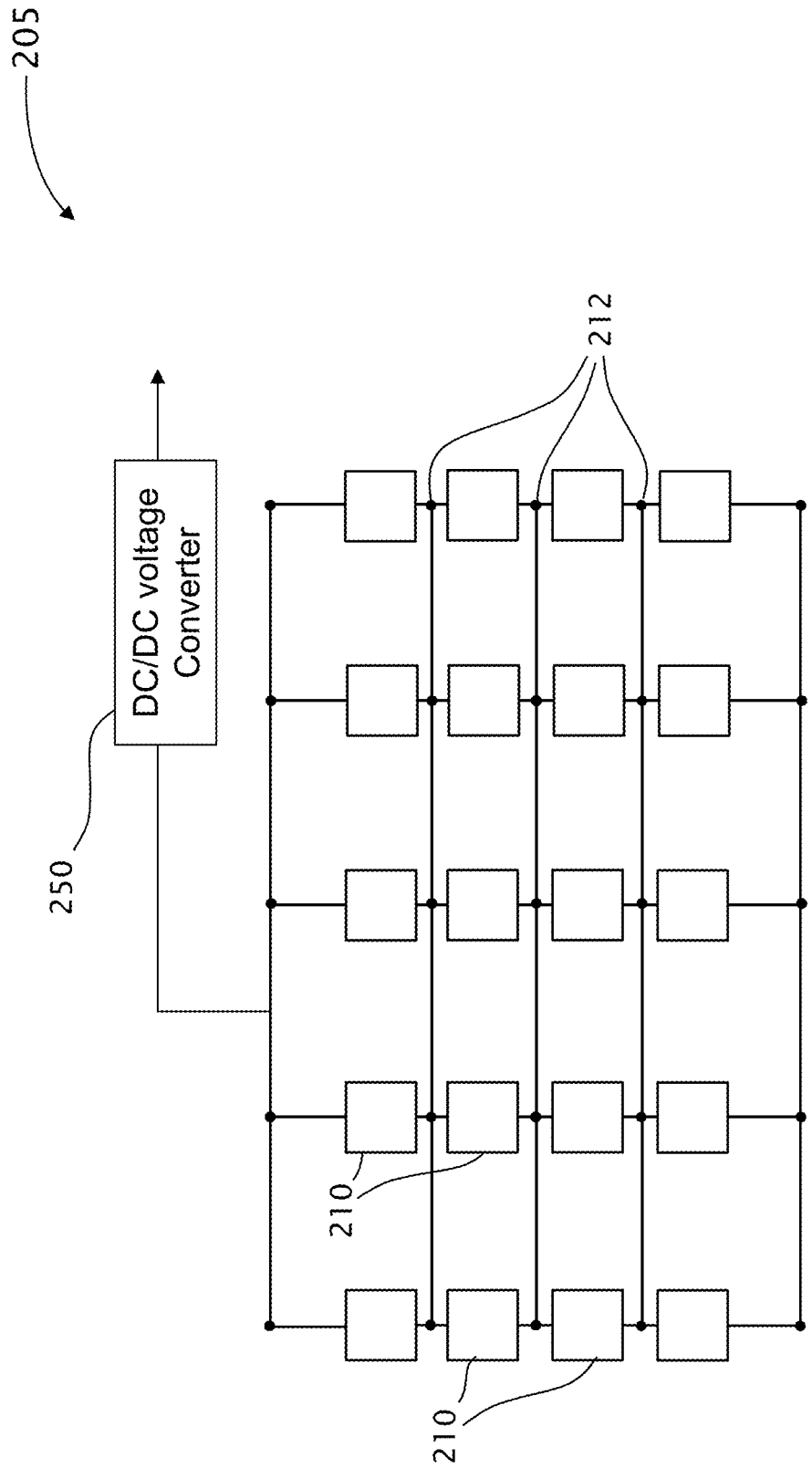
FIG. 3 (prior art) is a schematic example of a solar cell module, wherein a DC to DC voltage converter is connected to the output of the solar cell matrix shown in FIG. 2.

Reference is now made to the drawings. FIG. 2 shows a prior art schematic illustration of a solar cell matrix network 200 having regular PV solar cells 210 interconnected in a crisscross configuration. FIG. 3 (prior art) is a schematic example of a solar cell module 205, wherein a DC to DC voltage converter 250 is connected to the output of solar cell matrix 200. Such embodiments are described in '607. It should be noted that the DC to DC voltage converter 250 may be a push-pull converter, an UP converter, a forward converter, a maximum power point tracker (MPPT) device or other types of converters, or a combination thereof.

Figure 4:
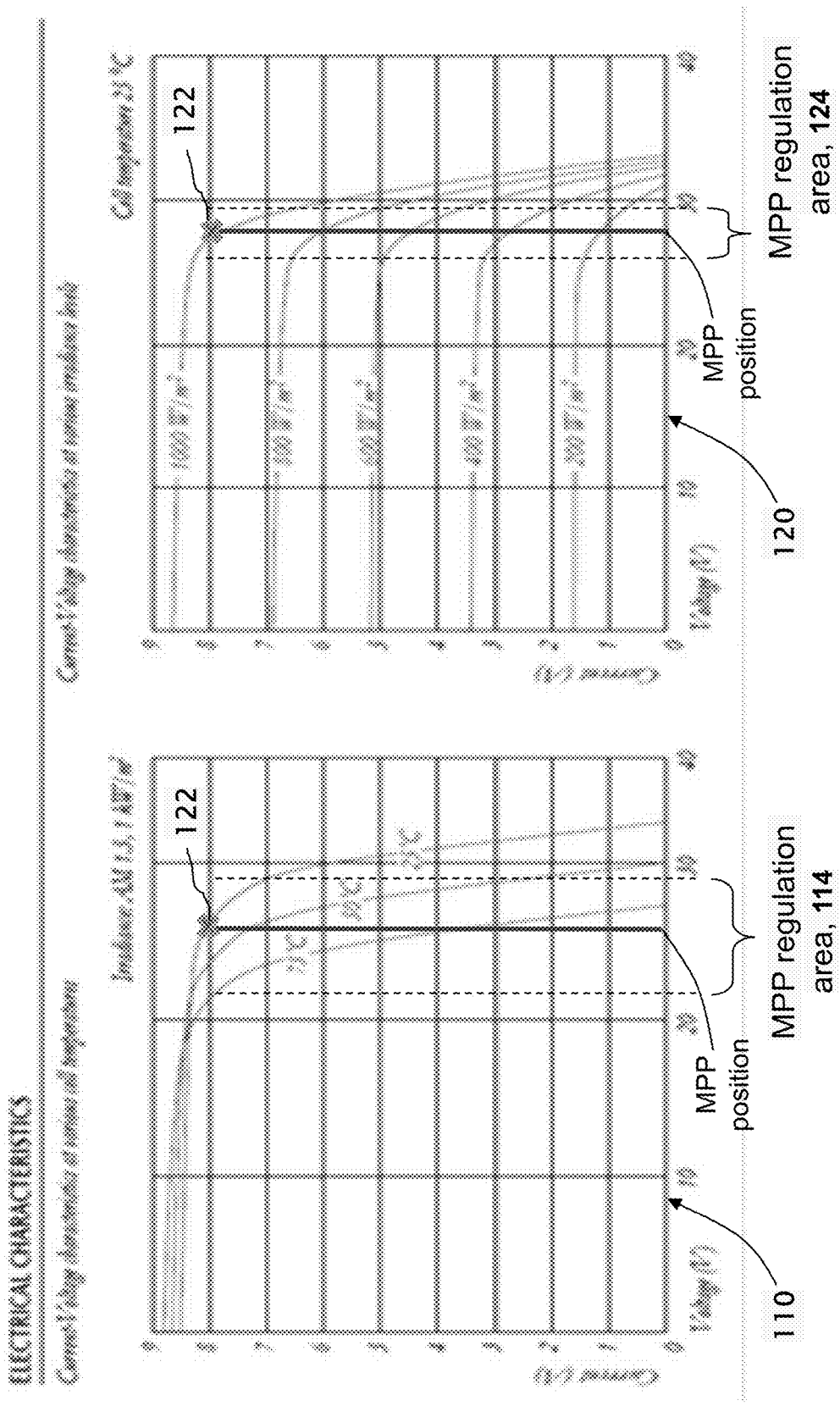
FIG. 4 (prior art) illustrates current-voltage characteristics of a typical solar array module, with various cell temperatures and various irradiance levels, including voltage range of maximum power point regulation zone.

An aspect of the present invention is to provide a system that bring each solar-array module to work at the Maximum Power Point (MPP) to maximize power generation. The power produced by a solar array system is affected by the cell temperature, the load on the system and the level of irradiance. FIG. 4 depicts two graphs (110, 120) of a solar module: current-voltage characteristics at various cell temperatures graph 110 and current-voltage characteristics at various irradiance levels graph 120. In each of the graphs (110, 120), the width of the regulated zone (114, 124) may differ significantly, for example, as a function of the shading conditions. In addition, in each of the graphs (110, 120) the current remains generally steady as the voltage increases, until it drops down sharply at a certain voltage level, forming a knee-shaped curvature. At some point the knee is considered to have reached the Maximum Power Point (MPP) of the solar module. For example, at a radiance level of 1000 W/m$^2$, the MPP is denoted by point 122 (approximately 28V); and at a temperature of 25° C., the MPP is marked by point 112 (approximately 25V). Hence, if the irradiance level or the temperatures are changed, the MPP changes and the output power decreases.

Figure 5A:
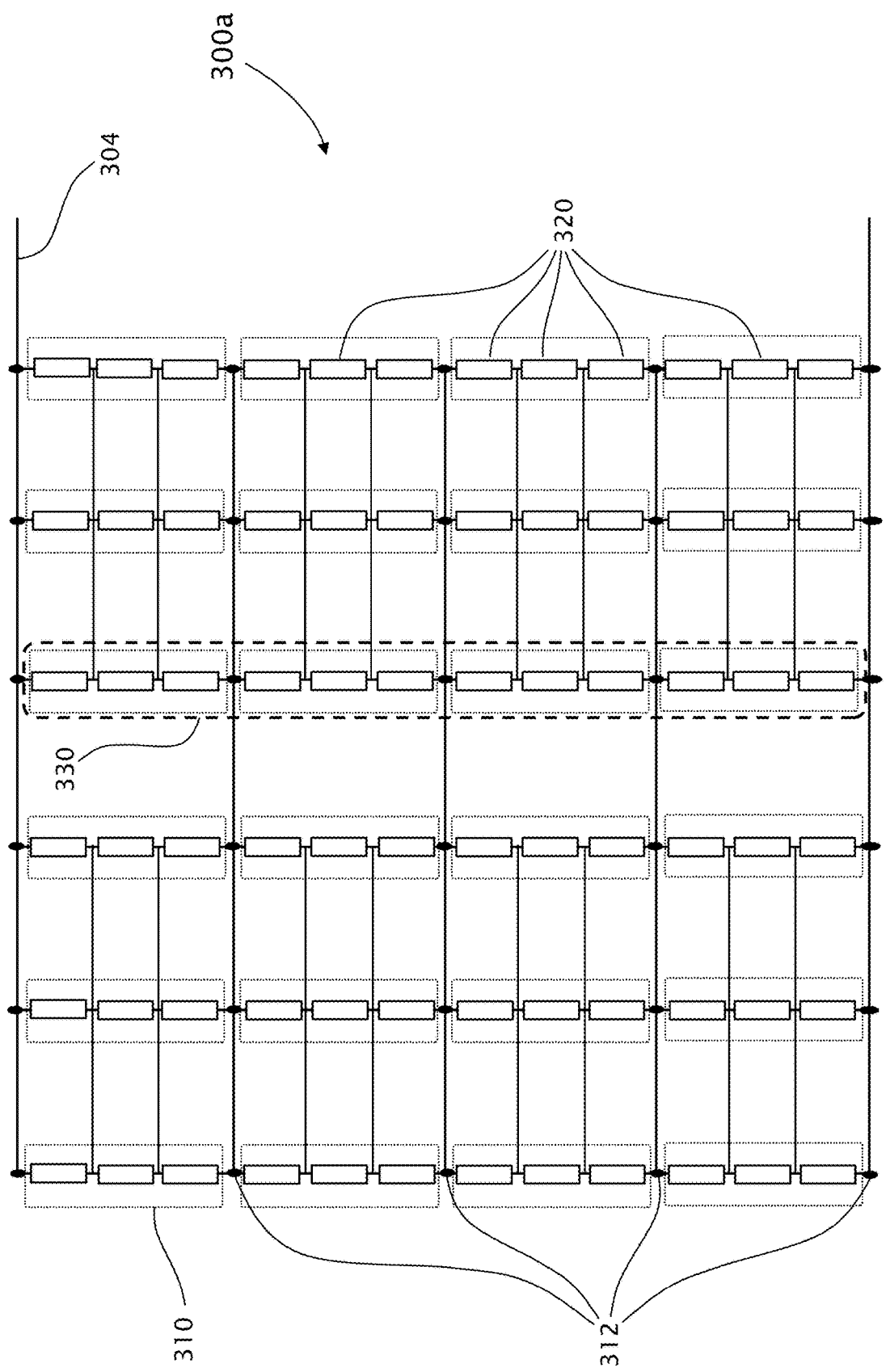
FIG. 5a is a schematic illustration of an example solar cell matrix having PV cell units interconnected in a crisscross configuration, according to some embodiments of the present invention, wherein each PV cell unit consists of 3 PV sub cells.

FIG. 5a is a schematic illustration of an example of a solar cell matrix network 300a having serial unit 310 of PV subs cells 320 interconnected in a crisscross configuration, according to some embodiments of the present invention, wherein the combined PV area of each serial unit 310, in this example, with no limitations, is equivalent to the PV area of a regular solar cell 210 (see FIG. 3). In some embodiments, a regular size PV cell 210 is cut into the desired number of sub cells with similar dimensions.

Figure 5B:
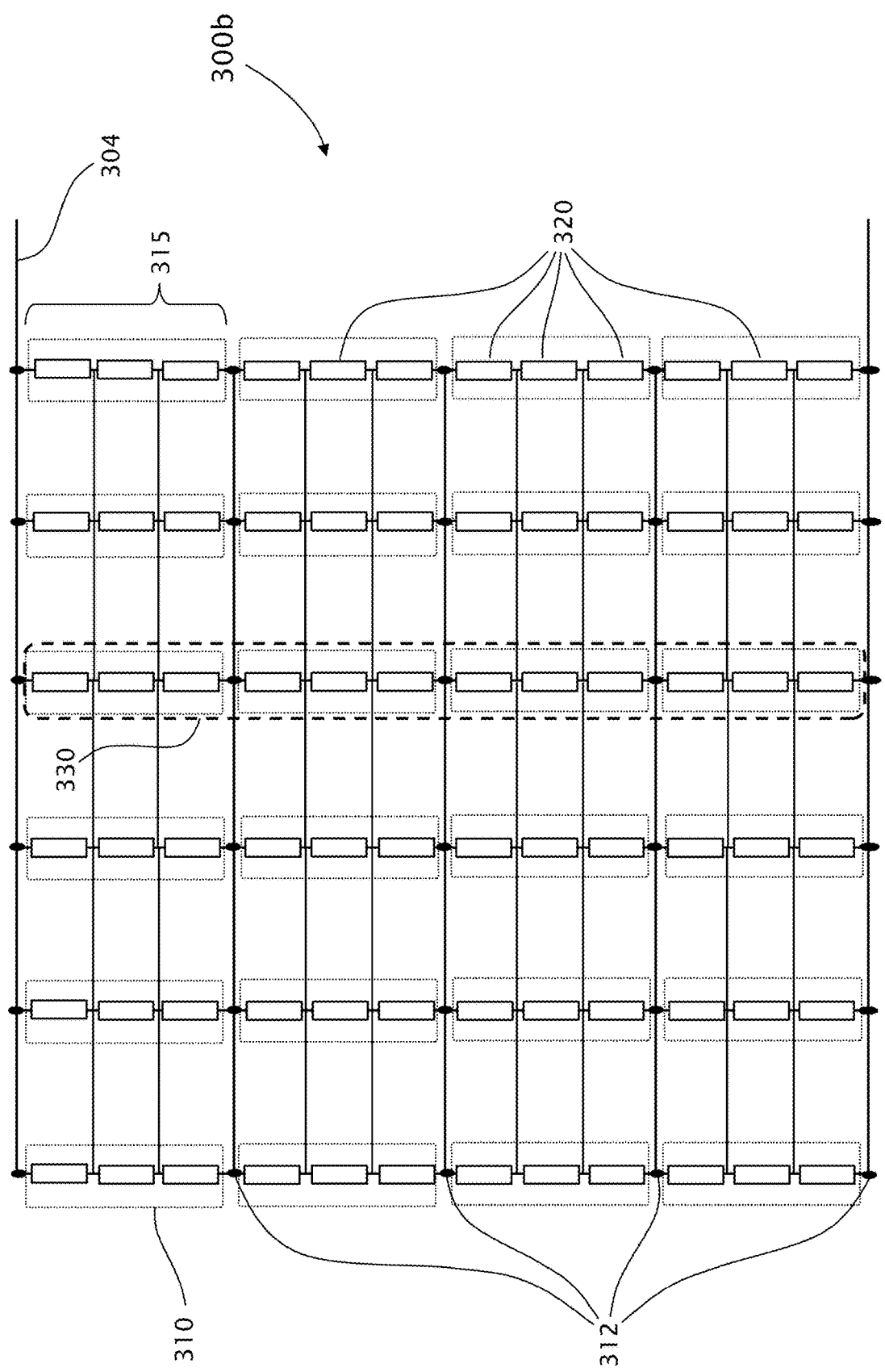
FIG. 5b is a schematic illustration of another example solar cell matrix having PV cell units interconnected in a crisscross configuration, according to some embodiments of the present invention, wherein each PV cell unit consists of 3 PV sub cells.

FIG. 5b is a schematic illustration of another example of a solar cell matrix network 300b having serial unit 310 of PV sub cells 320 interconnected in another crisscross configuration, according to some embodiments of the present invention, wherein the combined PV area of each serial unit 310, in this example, with no limitations, is equivalent to the PV area of a regular solar cell 210. In some embodiments, a regular size PV cell 210 is cut into the desired number of sub cells with similar dimensions.

In these example matrices 300, it is shown that each regular cell (210) is subdivided into 3 (three) sub cells. It should be noted that if the total number of sub cells 320 in a matrix 300 is denoted by "n", the total number of sub cells 320 may be: 0<n<a myriad number.

Figure 6:
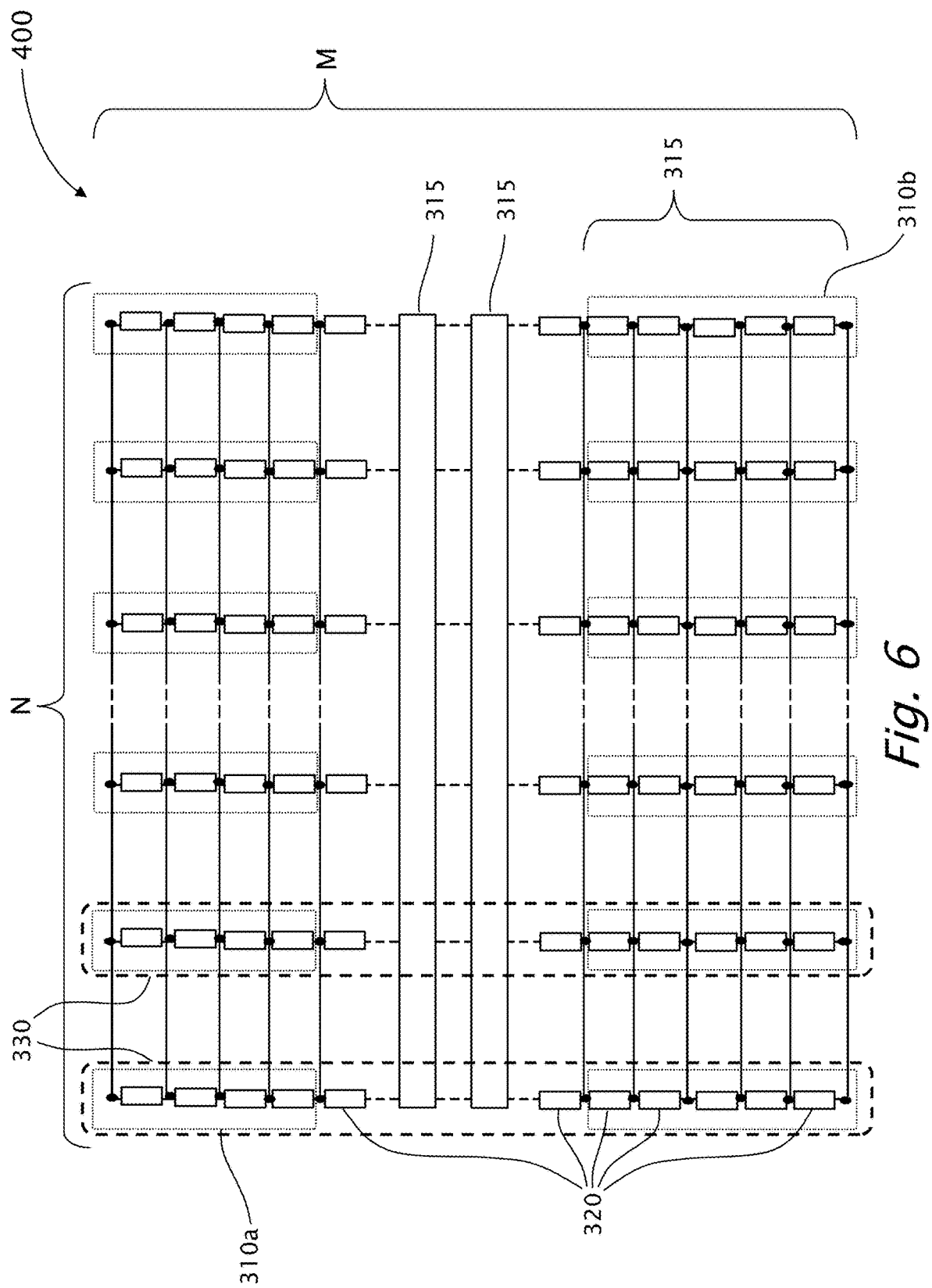
FIG. 6 is a schematic illustration of another example of a solar sub cells matrix, wherein each PV cell unit consists of at least one PV sub cell, interconnected in a crisscross matrix configuration of M rows and N columns, according to some embodiments of the present invention.

FIG. 6 is a schematic illustration of another example solar cell matrix 400, wherein each PV cell unit 310 consists of "n" PV sub cells 320, wherein the number of sub cells 320 of matrix 400 may include any quantity "n" of sub cells 320, and wherein the PV sub cells 320 are interconnected in a crisscross configuration.

In the crisscross configuration, a preconfigured number of PV solar sub cells 320, being at least one PV solar sub cells 320, are electrically connected in series to form a serial unit 310, wherein a preconfigured number of the serial units 310 are electrically connected in series to form a string of serial-units 330, and wherein the string of serial-units 330 is adapted to produce a first output voltage level. The preconfigured number of strings of serial-units 330 are electrically connected in parallel to form the module array (300, 400) of the PV solar sub cells 320, wherein the module array (300, 400) is adapted to produce a first output power level.

Furthermore, each serial-unit 310 of each of the strings of serial-units 330 is also connected in parallel to the neighboring serial-units 310 of all other strings of serial-units 330, to form rows 315 of serial-units 310 and the crisscross matrix array (300, 400) of serial units 310. The crisscross matrix array (300, 400) of the serial units (310) allows currents to bypass malfunctioning serial units 310, thereby improving the performance of the matrix array (300, 400) and the system thereof.

A matrix array (300, 400) may include a mix of rows 315 of various sizes of serial-units 310 of PV sub cells 320 connected serially. For example, FIG. 5a illustrates serial-units 310 of 3 (three) PV sub cells 320; and FIG. 6 illustrates serial-units 310 of 4 (four) PV sub cells 320 as well as 5 (five) PV sub cells 320.

Figure 7A:
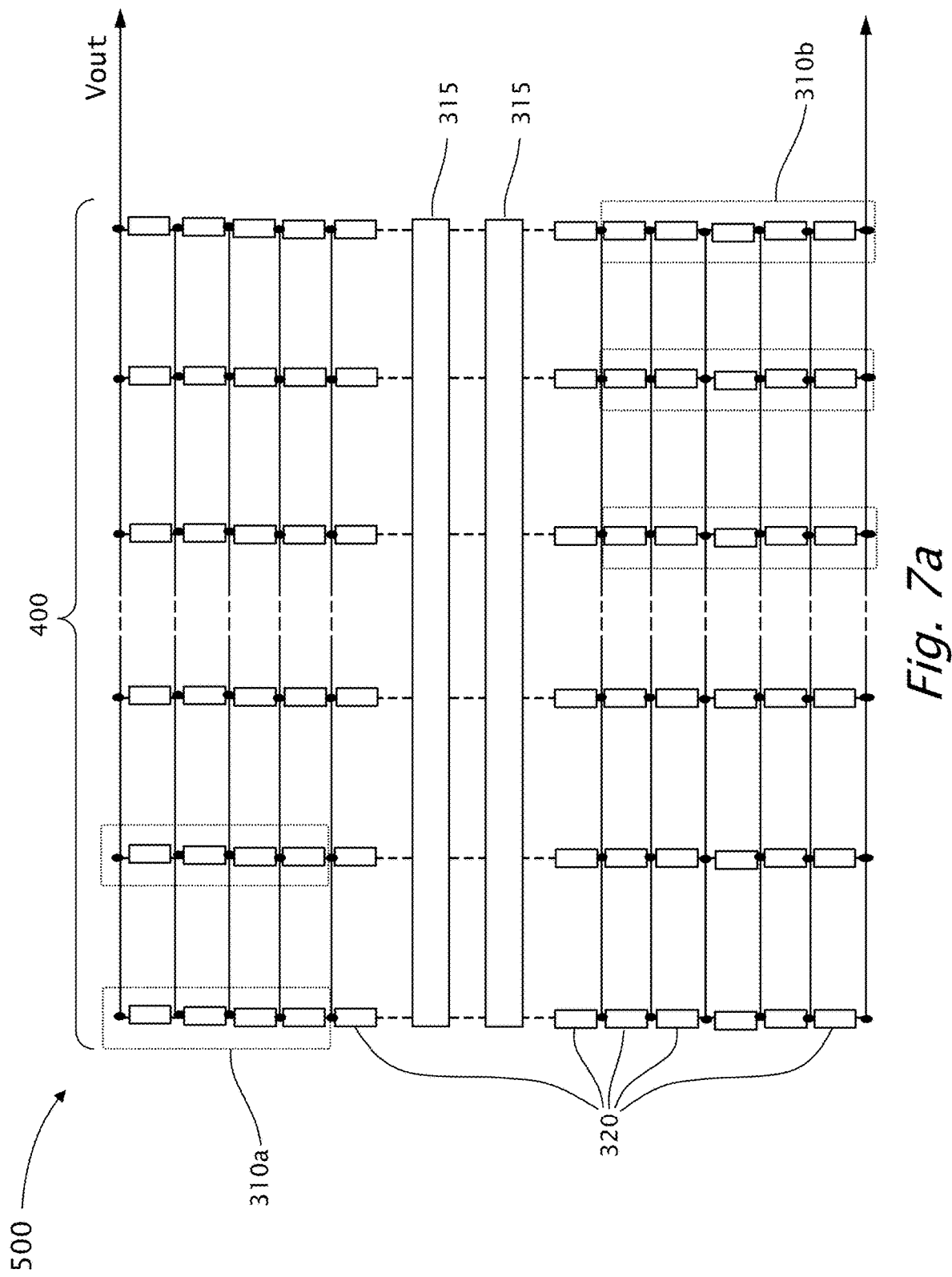
FIG. 7a is a schematic illustration of an example solar cells panel, wherein the matrix of the solar sub cells of the panel is, for example with no limitations, similar to the solar cell matrix shown in FIG. 6.

Reference is now also made to FIG. 7a that schematically illustrates an example solar cells panel 500, wherein the matrix of solar cell 310/320 of panel 500 is, for example with no limitations, similar to solar cell matrix 400.

Figure 7B:
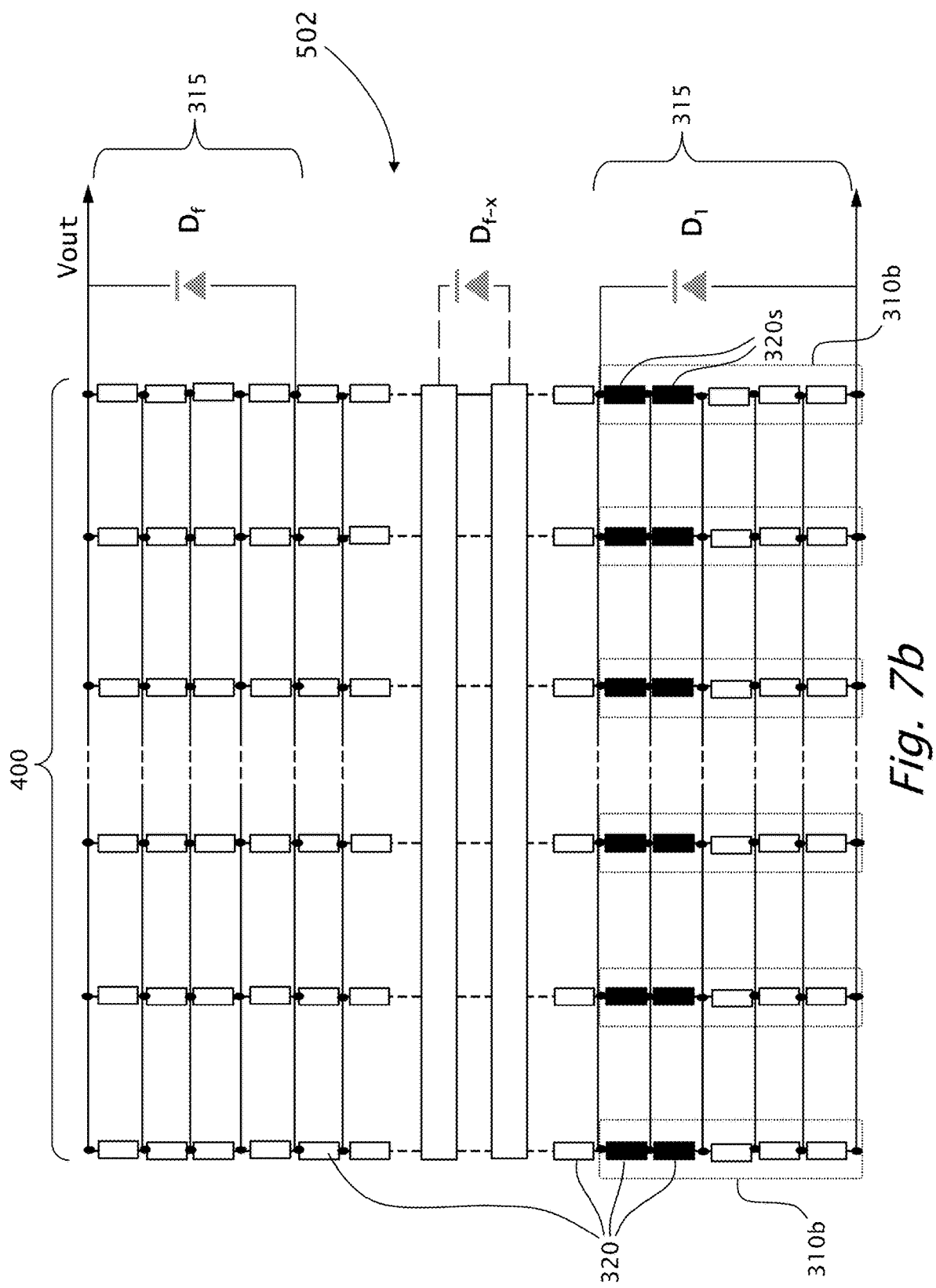
FIG. 7b is a schematic illustration of an example of a solar cells panel shown in FIG. 7a, wherein two rows of sub cells are shaded, and wherein one or more bypass diodes are connected, when each diode bypasses one or more respective rows of solar cell units.

FIG. 7b, shows a solar panel 502 with partial shading, wherein two rows of sub cells 320s are shaded. Solar panel 502 includes "n" PV sub cells interconnected in a crisscross configuration, as in solar cell matrix panel 500, wherein one or more bypass diodes are connected in parallel to a pre-configured number of rows 315 of solar cells 320 and/or serial units 310.

In such case of partial shading, sub cells 320s stop to provide power that causes a decrease in the energy yield of entire panel 502. In the example shown in FIG. 7b, the shaded area, that covers entire rows of sub cells 320, prevents current from flowing through illuminated sub cells 320 in the respective strings of cells. In order to resolve such a problem, a quantity of "f" bypass diodes "D" are connected in parallel to a preconfigured number of rows 315 of sub cells of solar matrix array 400, as shown in FIG. 6. f may be one bypass diode D, or 3 bypass diodes D, or 60 bypass diodes D, or any other number of bypass diodes D, connected to one or more rows 315 of matrix array 400. The diodes D may be connected to one or more rows 315 of sub cells 320 or one or more rows 315 of serial unit 310, see for example bypass diode Di and connected to row 315 of serial unit 310 that contains shaded rows of sub cells 320s to thereby allow the string current to continue its flow.

Sub cells 320 of matrix solar array 400 may be arranged within a solar panel with or without bypass diodes D, and may also be operatively coupled with a MPPT device in order to avoid a mismatch between panels 500 connected in strings of panels. Such a mismatch may occur when one or more panels 500 malfunction or are partially shaded, as described above (see example on FIG. 7b) or in preceding patents/patent applications of the present applicant.

Figure 7C:
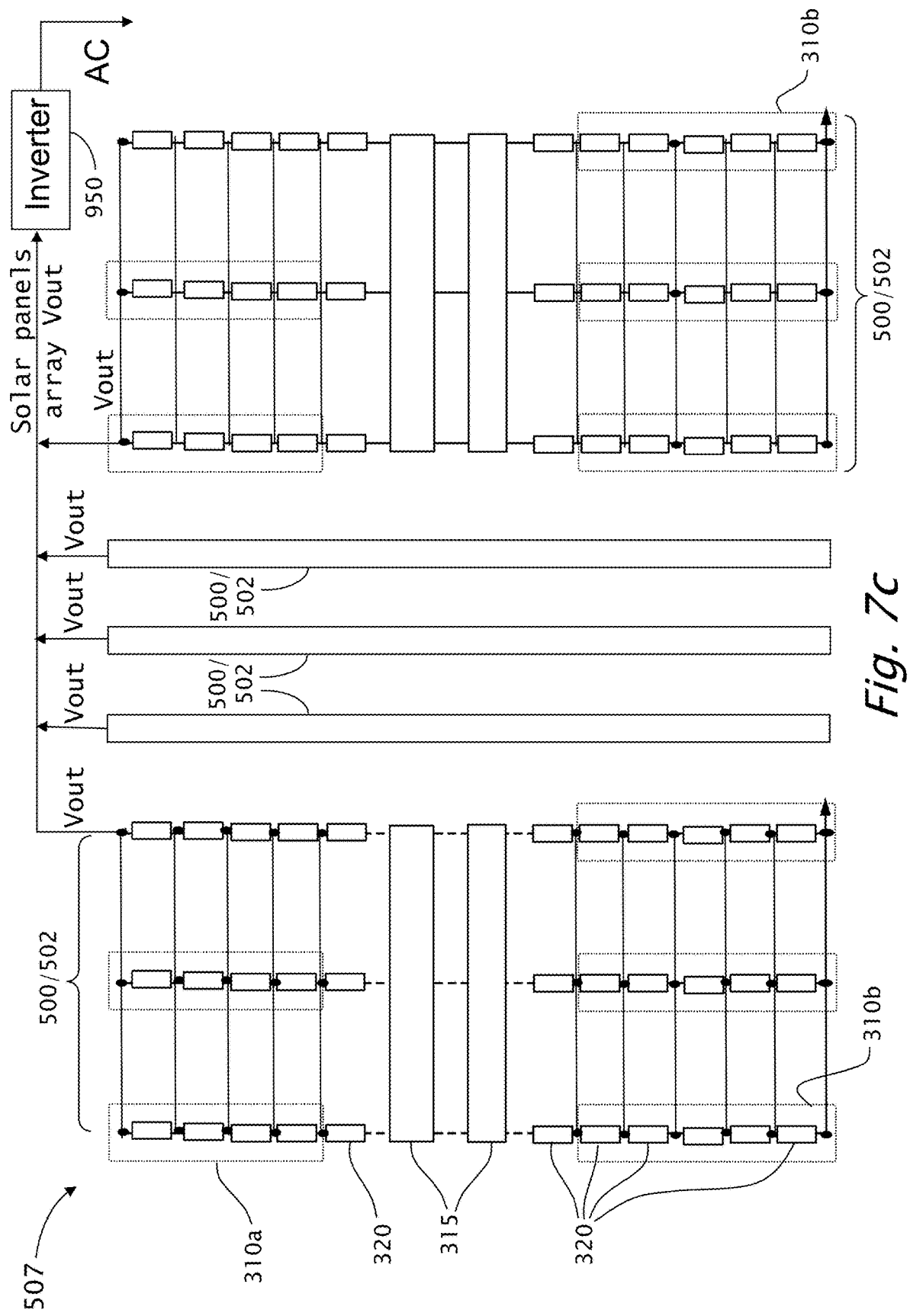
FIG. 7c is a schematic illustration of an example solar panels array (each panel, in this example, is similar to solar cell matrix panel shown in FIG. 7a), wherein the panels are connected in parallel, and wherein the solar array panels array is coupled with a panel DC/AC inverter, to invert the DC output voltage of the solar matrix array panel to AC voltage, for example to 220V or 110V, according to embodiments of the present invention.

FIG. 7c is a schematic illustration of an example of a solar panels array 507 (each panel in this example is, with no limitations, similar to solar cell matrix panel 500/502), wherein panels 500 are connected in parallel, and wherein the solar array panel is coupled with a panel DC/AC inverter 950, to invert the DC output voltage of the solar matrix array panel to AC voltage, for example to 220V or 110V, according to embodiments of the present invention.

Figure 7D:
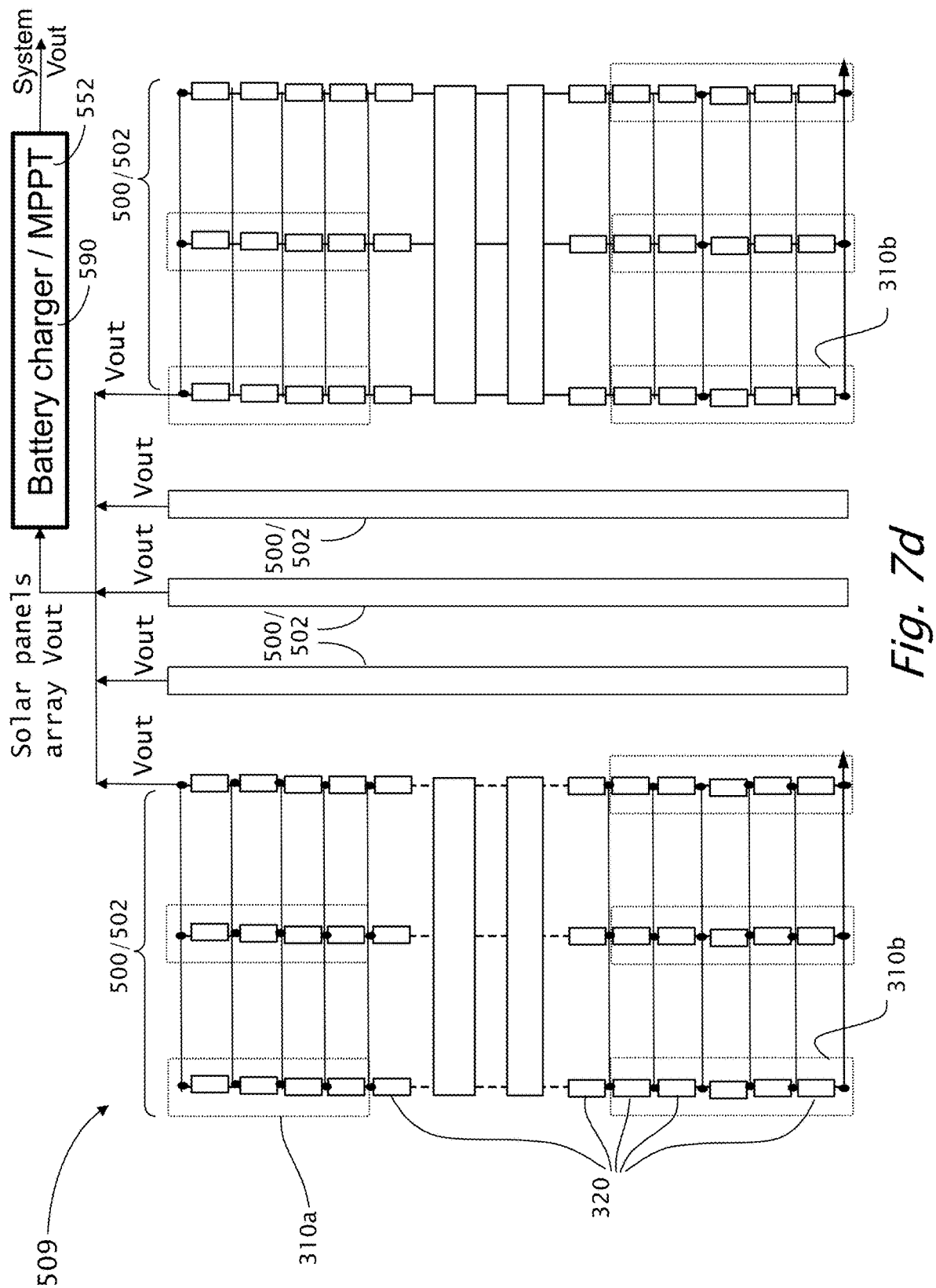
FIG. 7d is a schematic illustration of an example solar panels array, similar to the array of solar panels shown in FIG. 7c, but the array is serially connected to the input of a battery charger with maximum power point tracker (MPPT).
Figure 8A:
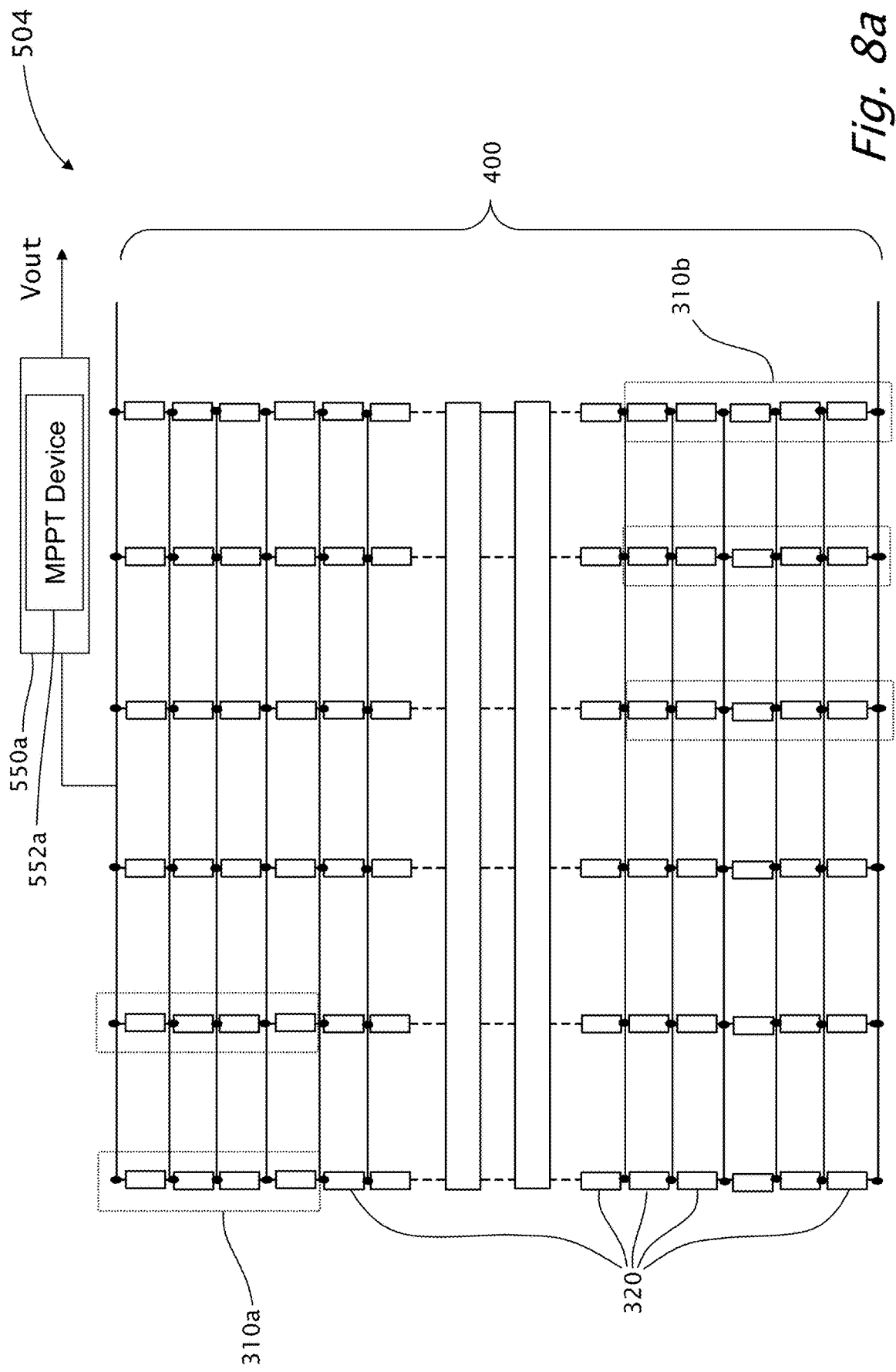
FIG. 8a is a schematic illustration of an example solar matrix array panel coupled with a power optimizer having a MPPT device, to provide maximum yield of power from the solar matrix array panel, according to embodiments of the present invention.

To deal with the problem of loss of power as a result of a changing MPP, and to bring each solar-array module to work at or closely to its MPP, such as MPP-Tracer 552, is used, as shown in FIGS. 7d, 8a and others. FIG. 7d is a schematic illustration of an example of a solar panels array 509, similar to the array of solar panels 507, but array 509 is serially connected to the input of a battery charger 590, typically having a maximum power point tracker (MPPT) optimizer 552.

Reference is also made to FIG. 8a, illustrates an example solar matrix array panel 504 coupled with a power optimizer 550a having a MPPT 552a, to form a solar matrix array panel 504. MPPT 552a based optimizer 550a is configured to provide maximum yield of power from the solar matrix array panel. The rows of sub cells of solar array matrix 400 of solar panel 504 are arranged without bypass diodes D and without a communication unit.

Figure 8B:
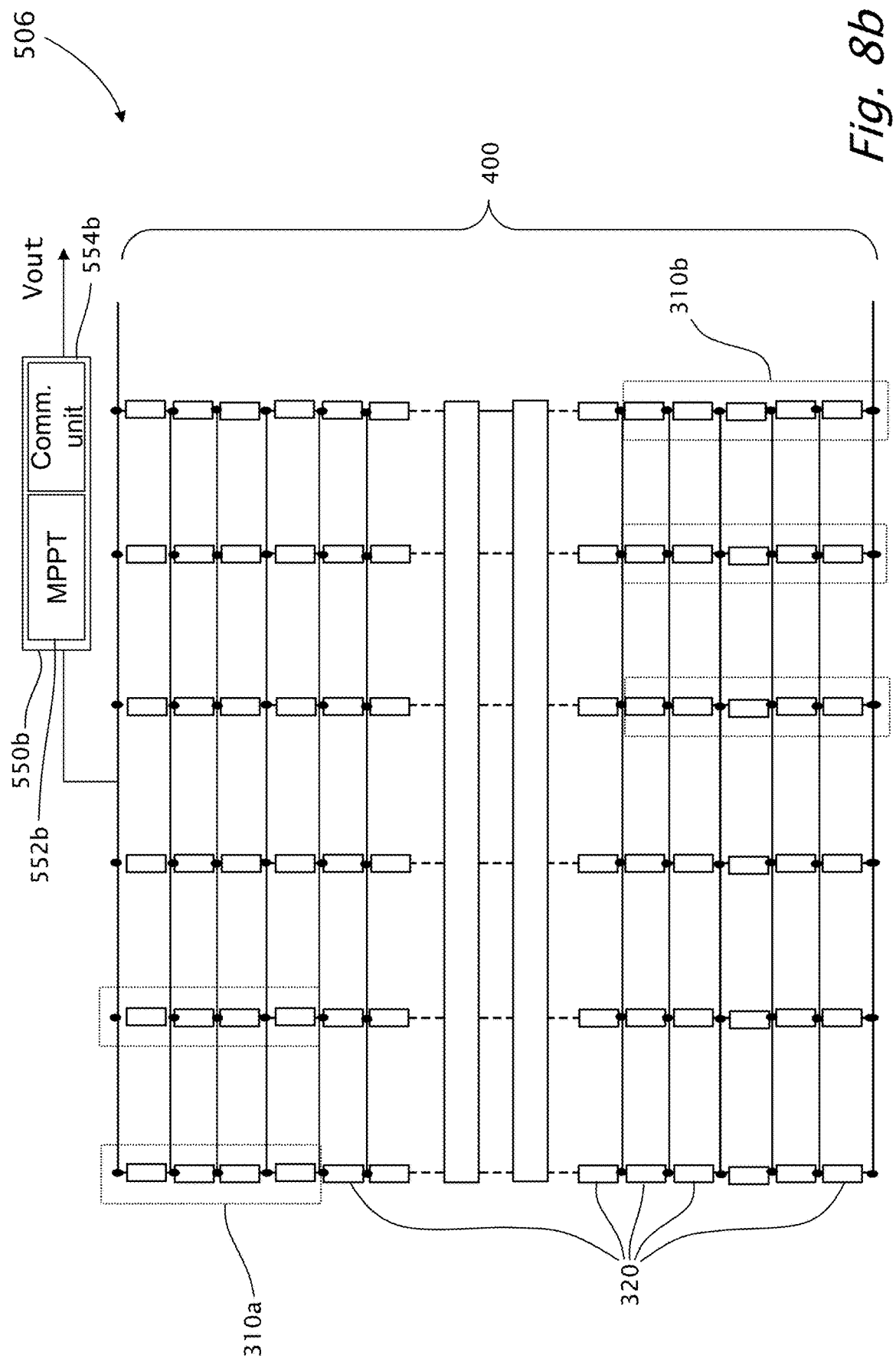
FIG. 8b is a schematic illustration of another example solar matrix array panel coupled with a power optimizer having a MPPT device and a communication unit, to form a monitoring and controlled solar matrix array panel, according to embodiments of the present invention.

FIG. 8b illustrates an example solar matrix array panel 506 coupled with a power optimizer 550b having a MPPT 552a and a communication unit 554b, to form a solar matrix array panel 506. The rows of sub cells of solar array matrix 400 of solar panel 504 are arranged without bypass diodes D.

Figure 8C:
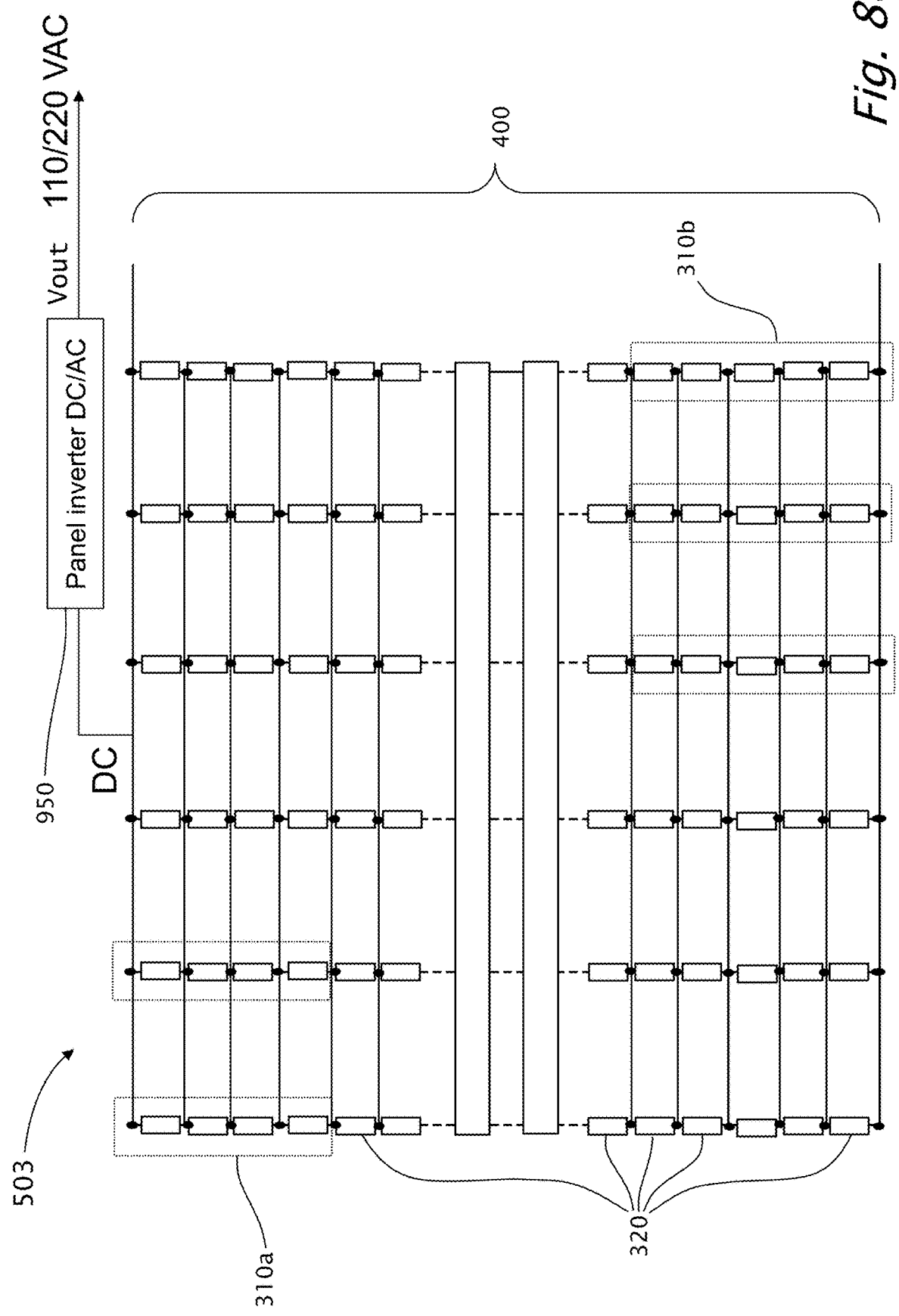
FIG. 8c is a schematic illustration of another example solar matrix array panel coupled with a panel DC/AC inverter, to invert the DC output voltage of the solar matrix array panel to AC voltage, for example to 220V or 110V, according to embodiments of the present invention.

FIG. 8c is a schematic illustration of an example solar matrix array panel 503 composed of a matrix solar array, such as matrix solar array 400, that provides DC voltage and is serially connected to an inverter 950 that invert the DC voltage to AC voltage, for example, grid compatible electric power.

Figure 8D:
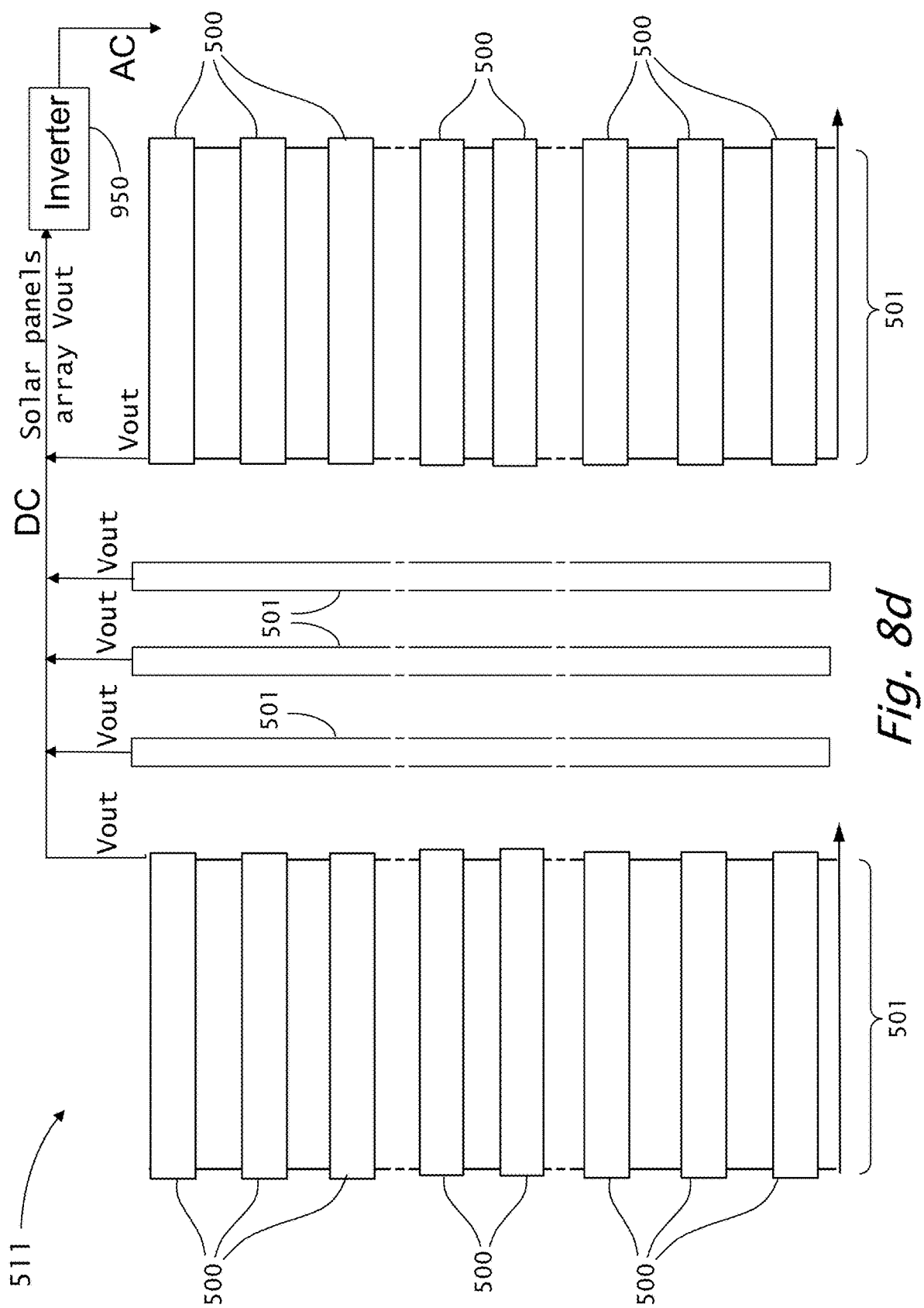
FIG. 8d is a schematic illustration of another example of an array of parallelly connected strings of solar panels array, as shown, with no limitations in FIG. 7c, wherein each string of solar panels array is serially coupled with a panel DC/AC inverter that is connected in parallel in their AC outputs, according to embodiments of the present invention.

FIG. 8d is a schematic illustration of an example solar array system 511 composed of parallelly connected strings (501) of solar panels array, in this example, an array of solar panels 500, connected in series, wherein the array of parallel connected strings of solar panels 501 provides DC voltage to an inverter 950 that invert the DC voltage to AC voltage.

Figure 9:
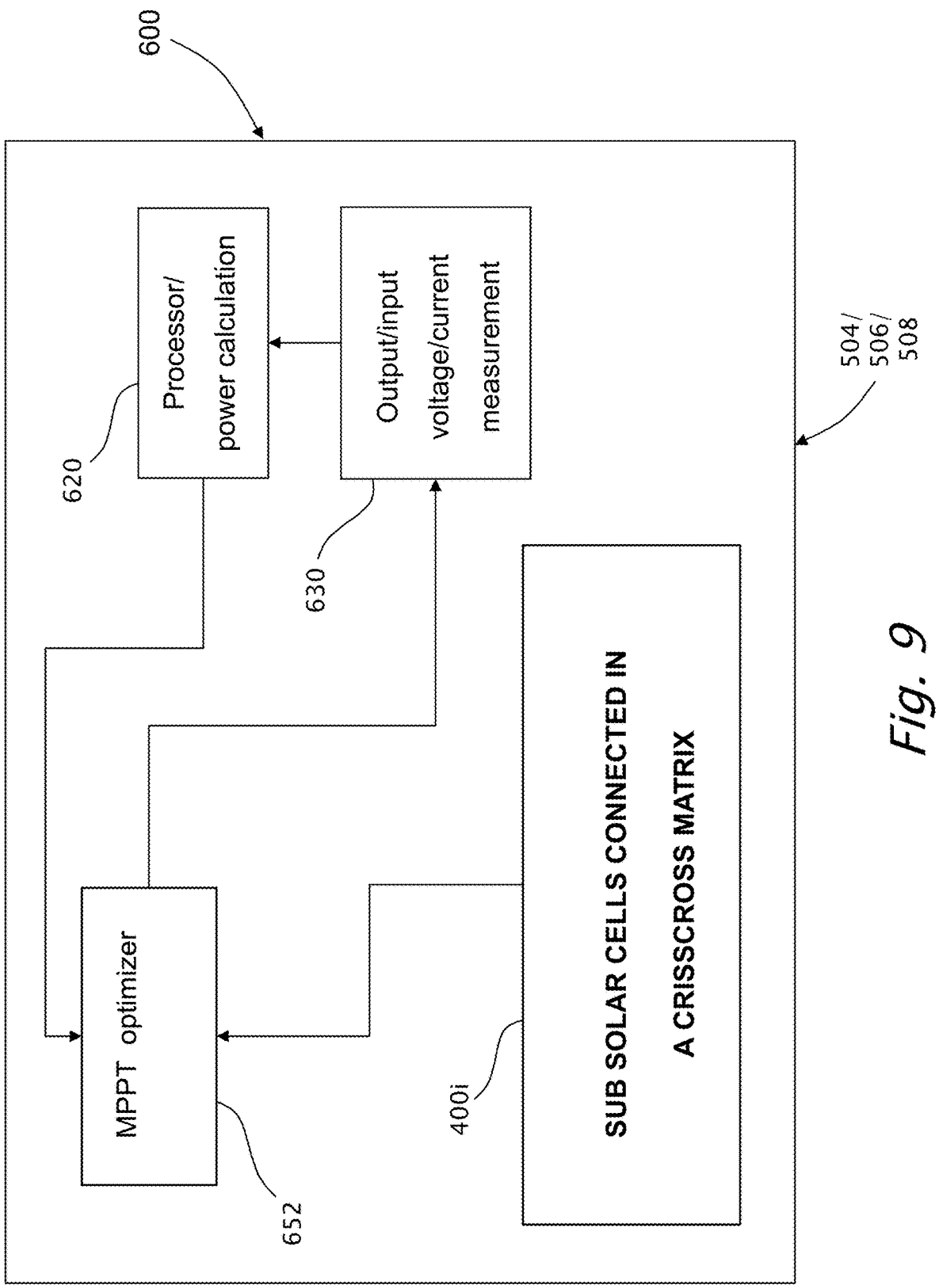
FIG. 9 is a schematic illustration showing an example of a solar-array module, including an array of crisscross network of solar sub cells and a MPPT optimizer, an input/output voltage/current measurement unit, a processor for power calculations.

FIG. 9 is a schematic illustration showing an example of a solar-array system module 600 including an electronic MPPT optimizer, an output voltage/current measurement unit 630 and a processor 620 for MPP regulation of a crisscross matrix of sub solar cells array 400i, for example, with no limitations, being part of solar panel systems 504, 506 and/or 508. The resulting measurements are obtained from MPP based optimizer 652 by processor 620, which may thereby change the output voltage of a solar array panel such as solar array panel 504/506/508.

Figure 10:
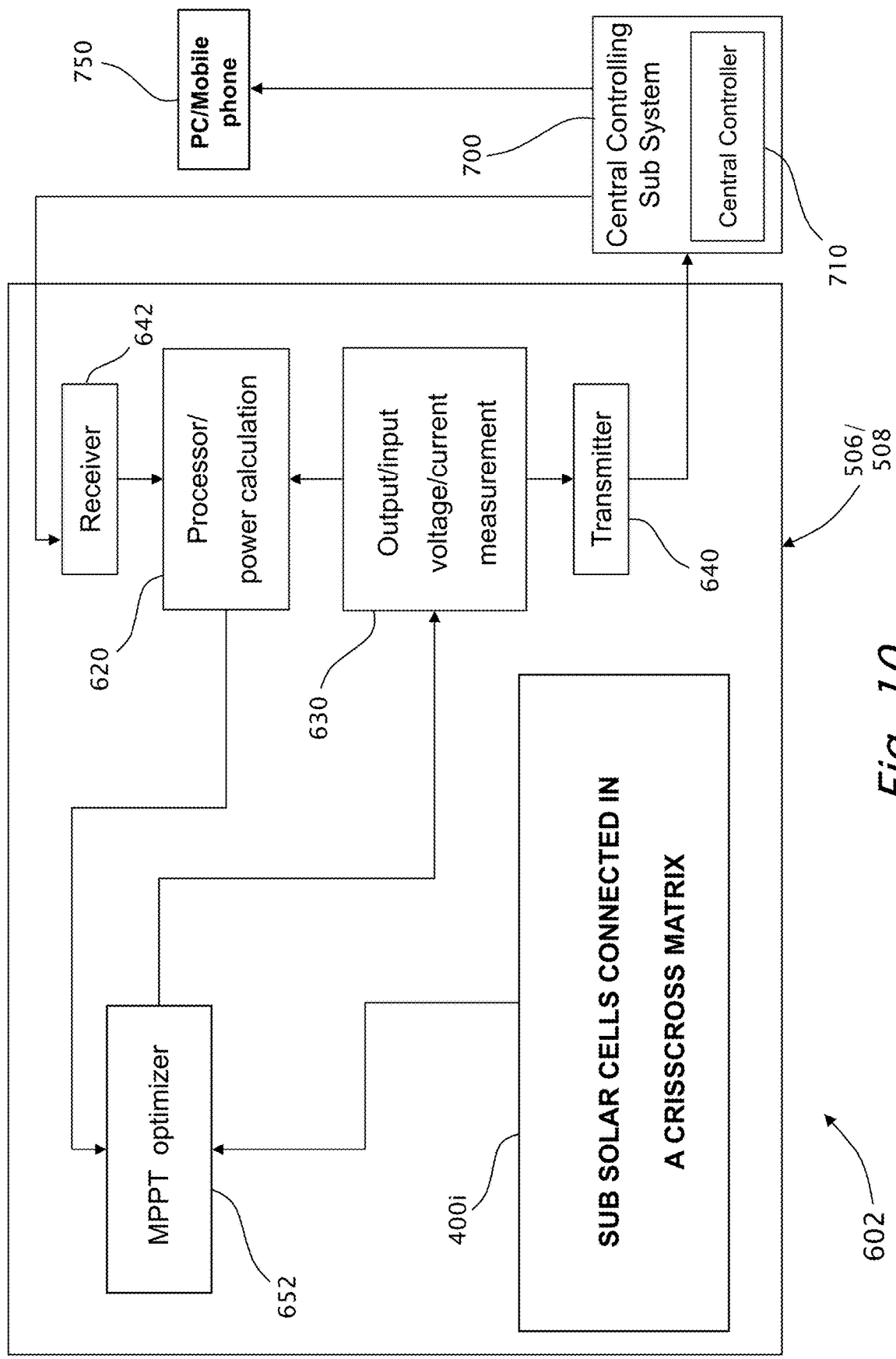
FIG. 10 is a schematic illustration showing an example of a solar-array module, including an array of crisscross network of solar sub cells and a MPPT optimizer, an input/output voltage/current measurement unit, a processor, a transmitter and a receiver, for transferring measurement data from a solar-array module to the general system central controller (CC) and for transferring CC commands to each solar-array module and optionally, providing information to a remote computer or a remote smart mobile device of each panel or an entire system.

FIG. 10 is a schematic illustration showing an example of a solar-array system module 602 including a matrix array panel such as solar array panel 506/508 having, for example, crisscross matrix of sub solar cells 400i, wherein solar array panel 506/508 is coupled to operate with a central monitoring and command/control sub system 700.

Matrix array panel 506/508 further includes a MPPT optimizer 652, an input/output voltage/current measurement unit 630 and a processor 620. Solar-array system module 602 further includes a transmitter 640 that facilitate communication with central monitoring system sub 700, that may intervene in the control of each individual solar-array module 602 and an entire system of solar panels array. Each individual solar-array module 602 further includes a transmitter 640 for transferring the measurement data obtained from output/input voltage/current meter 630 to a central controller/processor 710 of central controlling sub system 700. Each individual solar-array module 602 further includes a receiver 642 for receiving control commands from central processor 710.

Optionally, central controlling sub system 700 further provides information to a personal computer or a smart mobile device (750) regarding features, such as panel energy, power, temperature and the like, of each panel or of the entire system 602 central controlling sub system 700 may be further configured to receive information from an operationally coupled remote computer or a remote smart mobile device (750), and for example, provides commands such as disable or enable a particular panel 506/508, and the entire system (array) of panels.

Figure 11A:
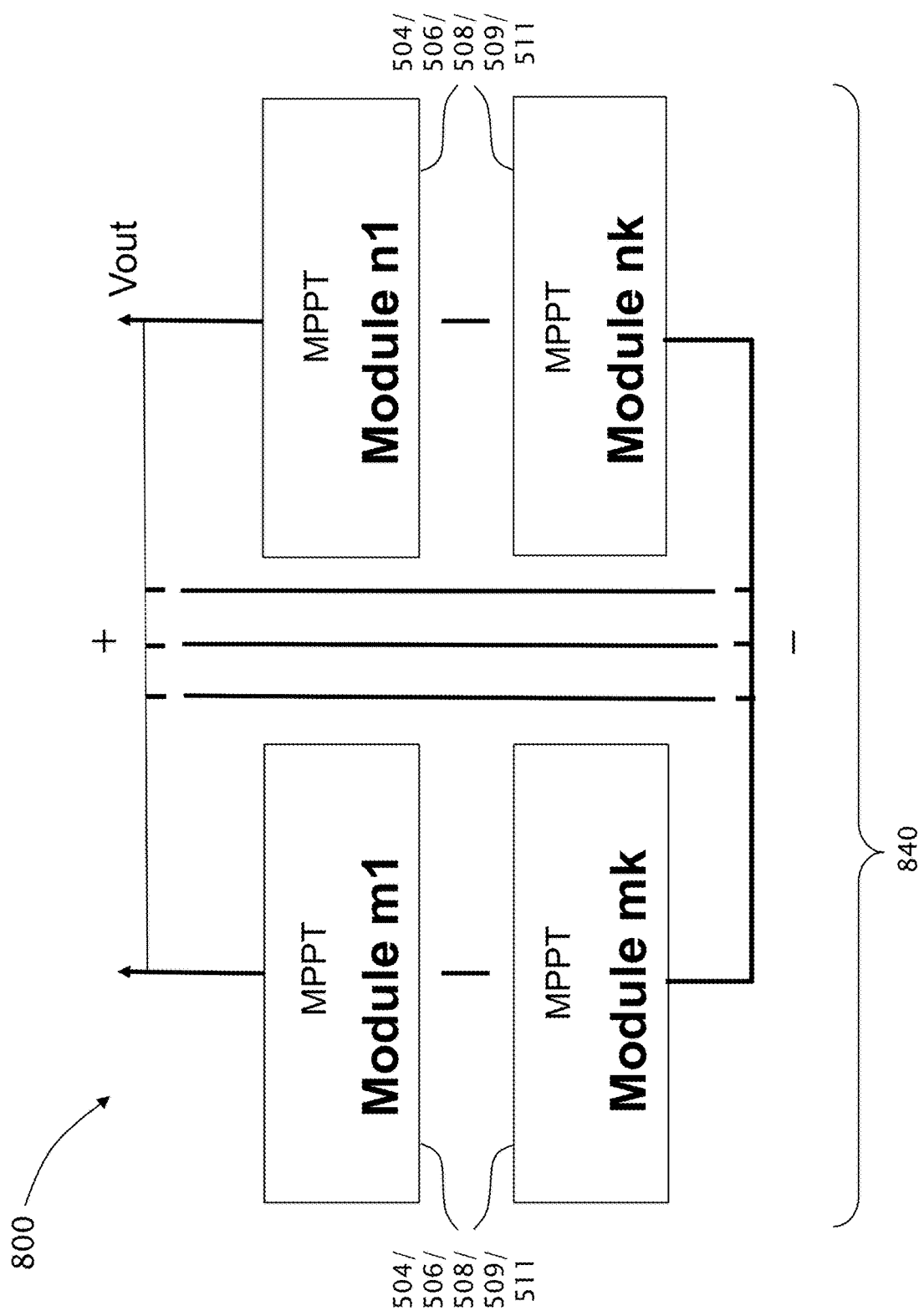
FIG. 11a is a schematic illustration showing an example solar-array system, having several strings of solar-array modules that are connected in parallel, wherein each solar-array module includes a MPPT optimizer and an array of solar cell units having "n" PV sub cells connected in a crisscross configuration.

Reference is also made to FIG. 11a, a schematic illustration showing an example solar-array system 800, having several strings 840 of solar-array panels 504/506/508/509/513 (each may optionally be characterized as previously described), wherein strings 840 of solar-array panels 504/506/508/509/513 are interconnected in parallel. Each solar-array panel 504/506/508/509/513 may have a MPPT optimizer and monitoring and command/control sub-system. Each solar-array panel 504/506/508/509/513 includes an array of serial units 310 having "n" PV sub cells 320 interconnected in a crisscross configuration.

Figure 11B:
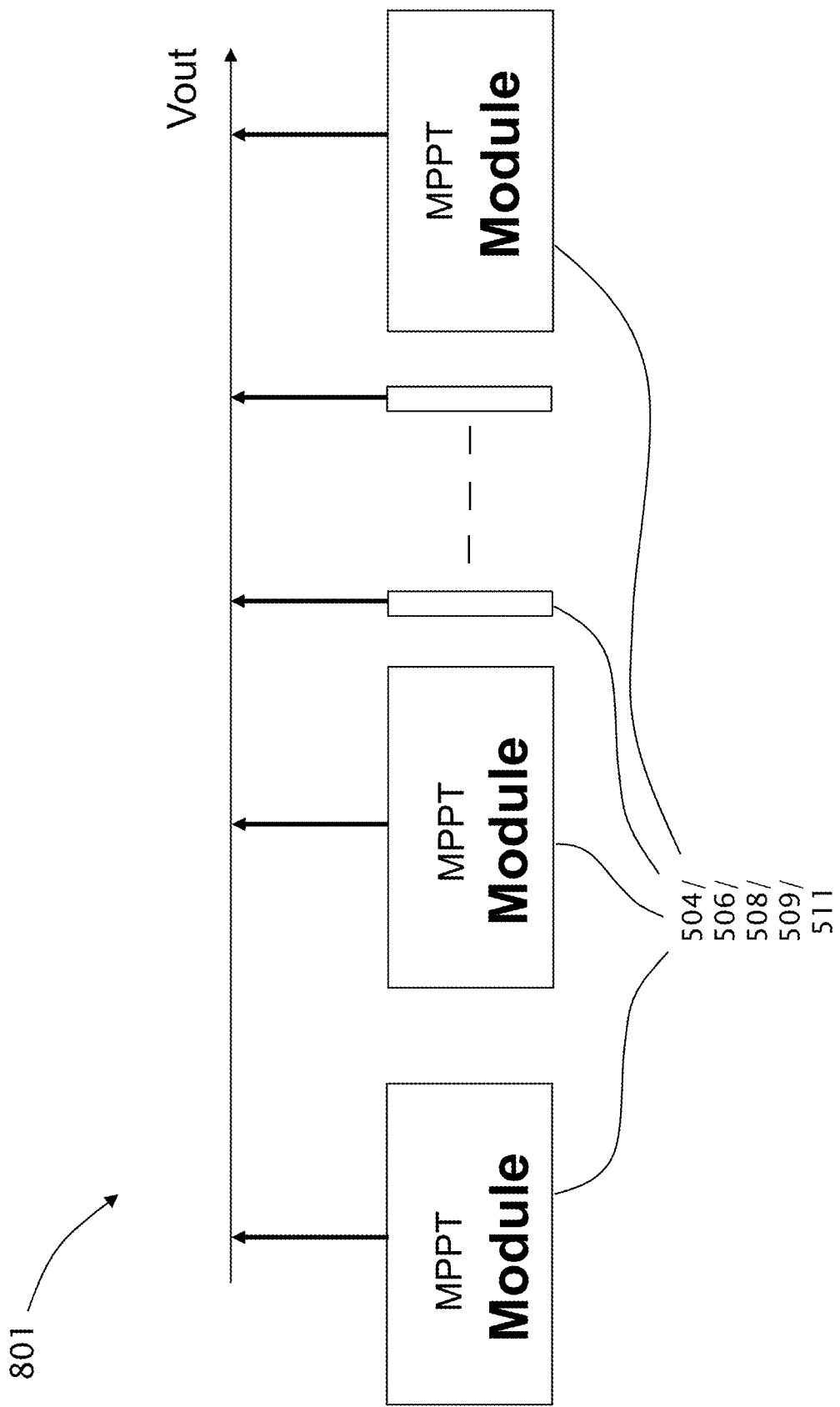
FIG. 11b is a schematic illustration showing an example solar-array system, having several solar-array modules that are connected in parallel, wherein each solar-array module includes a MPPT optimizer and an array of solar cell units having "n" PV sub cells connected in a crisscross configuration.

FIG. 11b, a schematic illustration showing an example solar-array system 801, having several parallelly connected solar-array panels 504/506/508/509/513, (each may optionally be characterized as previously described). Each solar-array panel 504/506/508/509/513 may have a MPPT optimizer and monitoring and command/control sub-system. Each solar-array panel 504/506/508/509/513 includes an array of serial units 310 having "n" PV sub cells 320 interconnected in a crisscross configuration.

It should be further noted that the regulation at the system level can still be performed by a DC/AC inverter (not shown) or by any of the aforementioned embodiments.

Figure 12A:
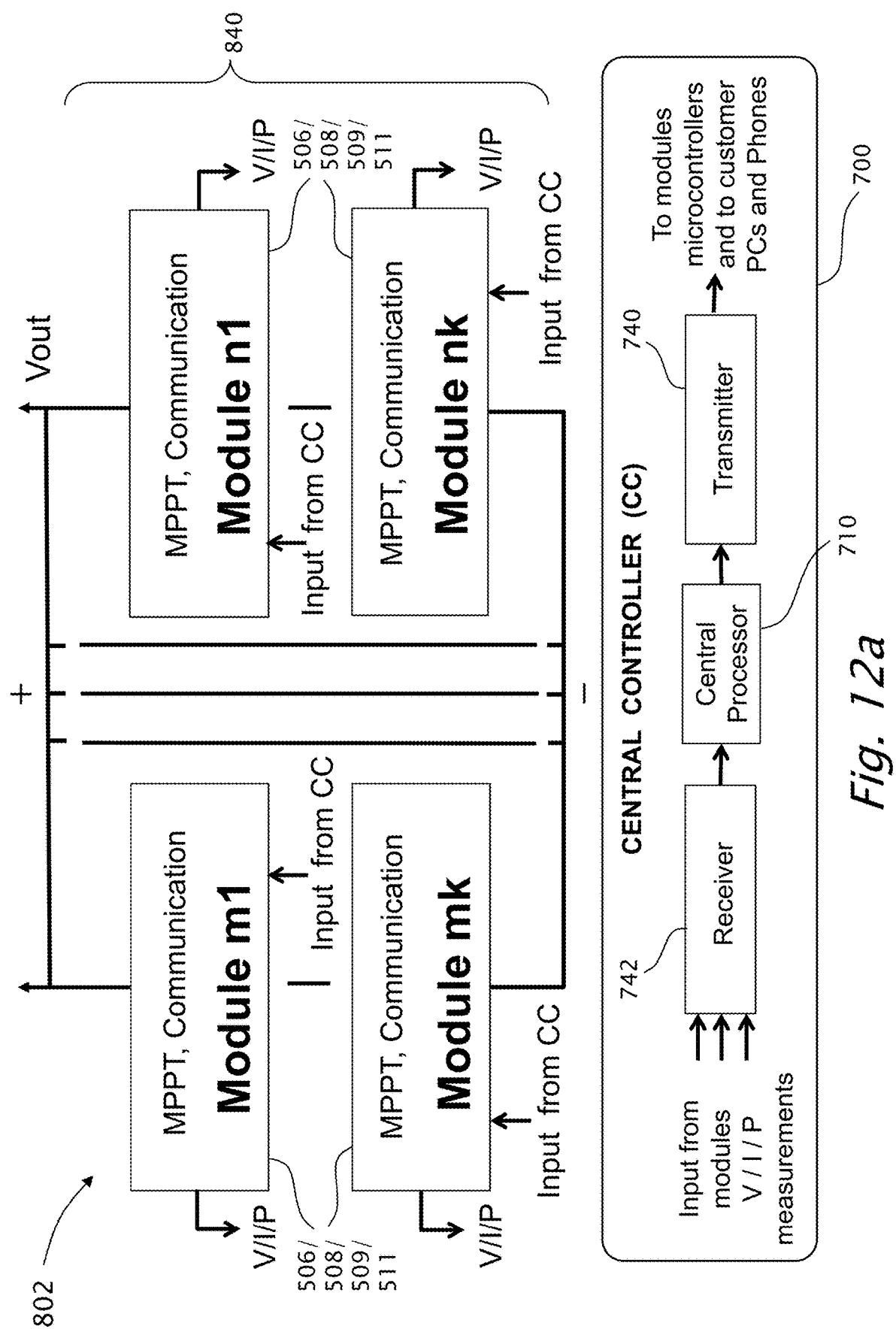
FIG. 12a is a schematic illustration showing another example solar-array system, having several strings of solar-array panels that are connected in parallel, wherein each solar-array module includes a MPPT optimizer, communication device and an array of solar cell units having "n" PV sub cells connected in a crisscross configuration, and wherein all solar-array modules are controlled by a central monitoring and control system and transmits data to customer PC or mobile phone.

Reference is also made to FIG. 12a, a schematic illustration showing another example solar-array system 802, having several strings 840 of solar-array panels 504/506/508/509/513 (each may optionally be characterized as previously described), wherein strings 840 of solar-array panels 504/506/508/509/513 are interconnected in parallel. Each solar-array panel 504/506/508/509/513 has a MPPT optimizer and monitoring and command/control communication sub-system. Each solar-array panel 504/506/508/509/513 includes an array of serial units 310 having multiple PV sub cells 320 interconnected in a crisscross configuration.

A central control sub system 700 having a central processor 710 received measurement data regarding voltage of each string 840 of solar-array panels 506/508/509/513, as well as voltage, current and output power of each solar-array panel 506/508/509/513. After receiving the data from solar-array panels 506/508/509/513 through receiver 742, central processor 710 sends the monitored data to customers PCs and Phones through transmitter 740.

Central controlling sub system 700 may be further configured to receive information from an operationally coupled remote computer or a remote smart mobile device (750), for example commands such as able or disable a particular panel 506/508/509/513 or entire solar panel's array and/or other commands or information.

It should be note that central control sub system 700 may communicate with each solar-array module 506/508/509/513 through either wirelessly or wired communication means.

It should be further noted that the regulation at the system level can still be performed by a DC/AC inverter (not shown) or by any of the aforementioned embodiments.

Figure 12B:
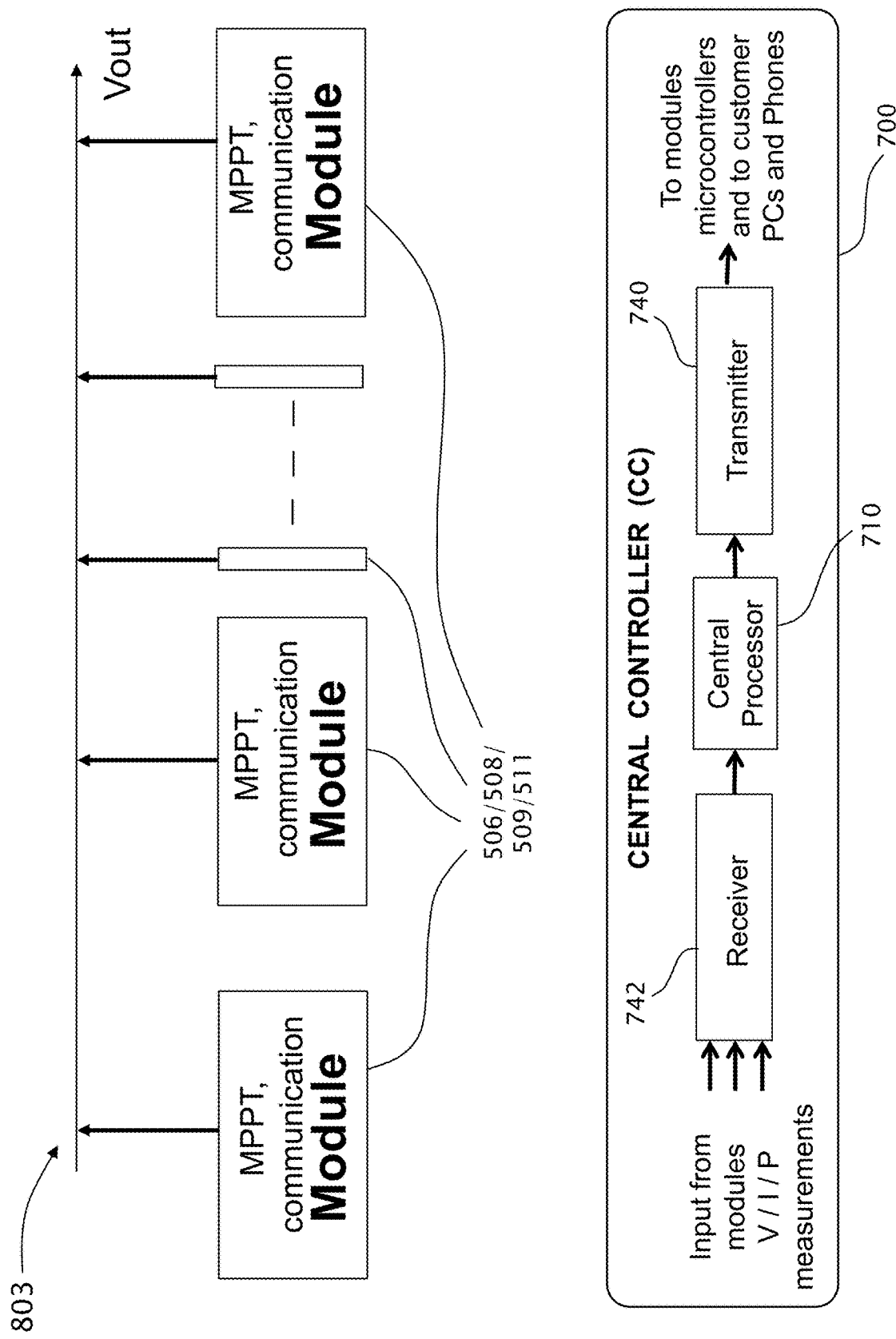
FIG. 12b is a schematic illustration showing another example of a solar-array system, having several solar-array panels that are connected in parallel, wherein each solar-array module includes a MPPT optimizer, communication device and an array of solar cell units having "n" PV sub cells connected in a crisscross configuration, and wherein all solar-array modules are controlled by a central monitoring and control system and transmits data to customer PC or mobile phone.

FIG. 12b, a schematic illustration showing an example solar-array system 803, having several parallelly connected solar-array panels 506/508/509/513, (each may optionally be characterized as previously described). Each solar-array panel 506/508/509/513 may have a MPPT optimizer and monitoring and command/control sub-system. Each solar-array panel 506/508/509/513 includes an array of serial units 310 having "n" PV sub cells 320 interconnected in a crisscross configuration.

A central control sub system 700 having a central processor 710 received measurement data regarding voltage of each string 840 of solar-array panels 506/508/509/513, as well as voltage, current and output power of each solar-array panel 506/508/509/513. After receiving the data from solar-array panels 506/508/509/513, through receiver 742 central processor 710 sends the monitored data to customer's PCs and Phones through transmitter 740.

Central controlling sub system 700 may be further configured to receive information from an operationally coupled remote computer or a remote smart mobile device (750), for example commands such as able or disable a particular panel 506/508/509/513 or entire solar panel's array and/or other commands or information.

It should be noted that central control sub system 700 may communicate with each solar-array module 506/508/509/513 through either wirelessly or wired communication means.

It should be further noted that the regulation at the system level can still be performed by a DC/AC inverter (not shown) or by any of the aforementioned embodiments.

Figure 13A:
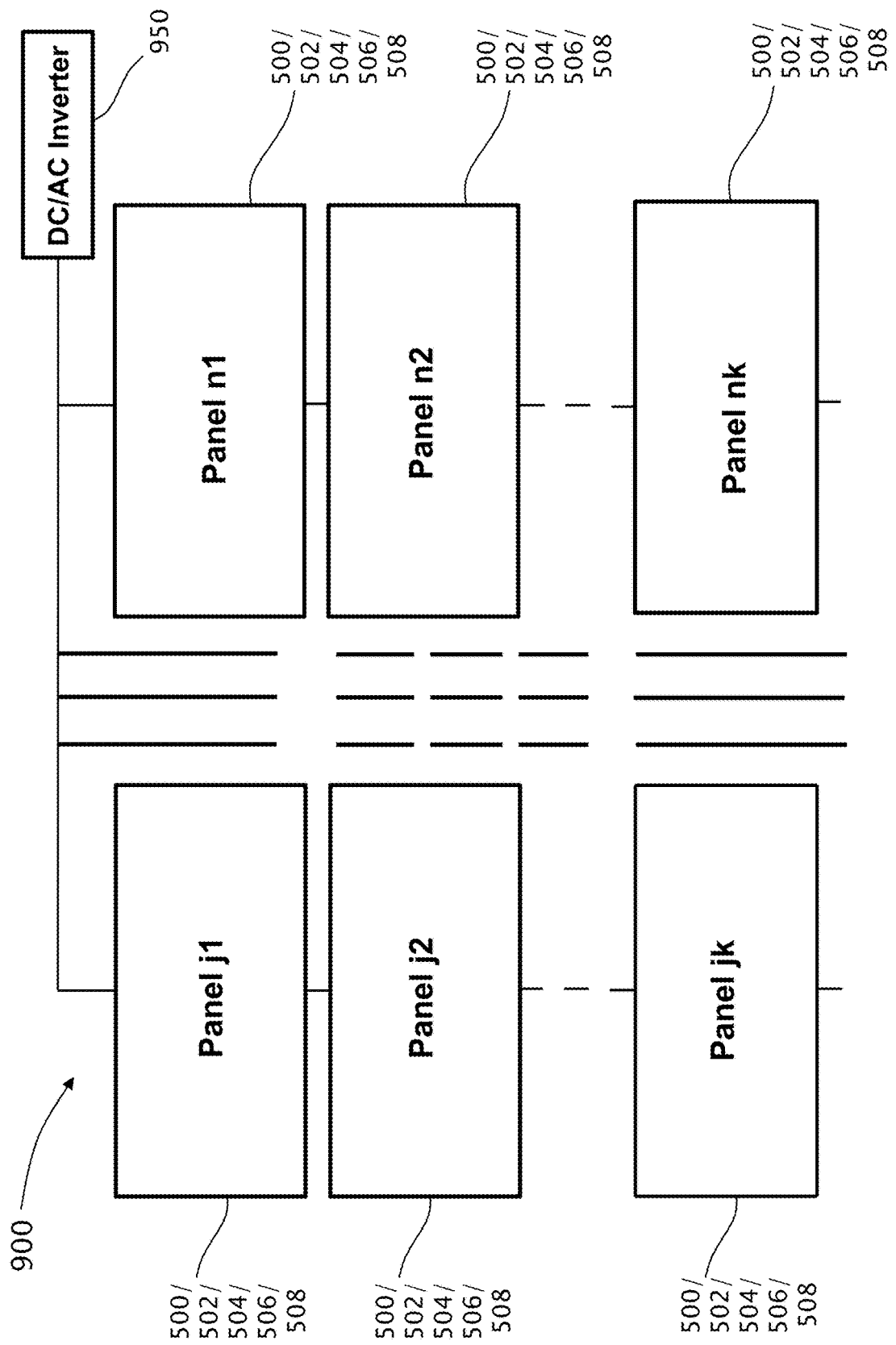
FIG. 13a is a schematic illustration showing an example solar-array system, having for example m*nsolar-array panels, wherein each panel includes a crisscross matrix of PV sub solar cells, and wherein the solar-array system includes a DC/AC inverter.
Figure 13B:
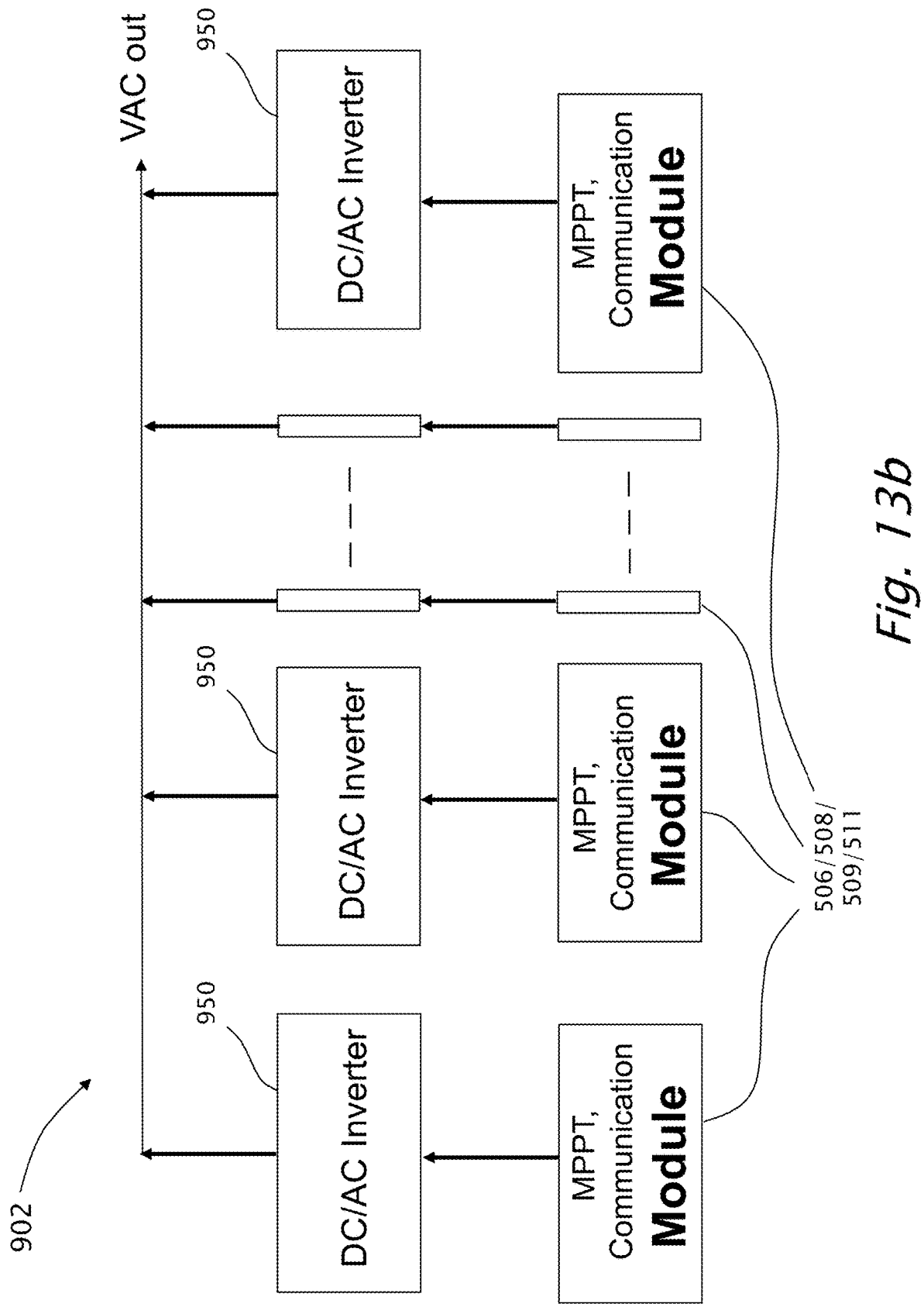
FIG. 13b is a schematic illustration showing an example solar-array system, having for example "n" solar modules when each one consists of solar panel equipped by MPPT optimizer and Communication devices, wherein each panel includes a crisscross matrix of PV sub solar cells, and wherein the DC/AC inverter is connected to each module.

To deal with the problem of systems panels array loss of power as a result of a changing MPP due to changing conditions of irradiance level (that is, access of the solar cells to light) and/or temperature, a DC/AC inverter 950, having a MPP-tracer, is used, as shown in FIGS. 13*a* and 13*b*.

13*a* is a schematic illustration showing an example solar-array system 900, having for example m*n solar-array panels 500/502/504/506/508, each including a crisscross matrix of solar cells 310/320, wherein the solar-array system 900 includes a common DC/AC inverter 950. However, this solution works at a solar system level and not at a solar-array module level. Thus, this solution does not enable each solar-array module to operate at its MPP, which would provide greater efficiency over the entire system.

FIG. 13*b* is a schematic illustration showing an example solar-array system 902, having for example parallelly connected solar-array panels 506/508/509/511, each including a crisscross matrix of solar cells 310/320. Each solar-array panel 506/508/509/511 is serially connected to a DC/AC inverter 950, before being parallelly interconnected.

Figure 13C:
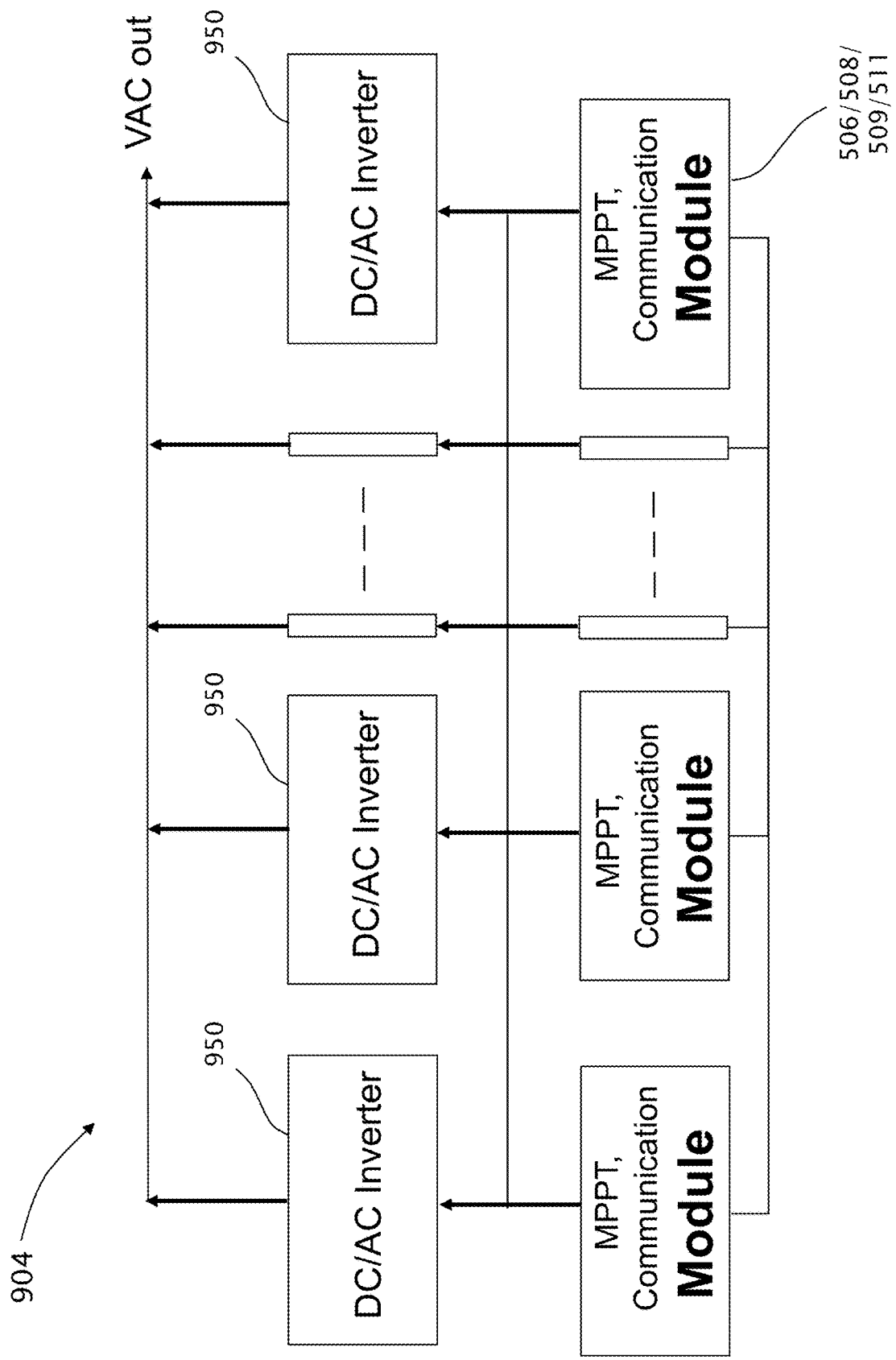
FIG. 13c is a schematic illustration showing an example solar-array system, having for example "n" solar modules when each one consists of solar panel equipped by MPPT optimizer and communication devices, wherein each panel includes a crisscross matrix of PV sub solar cells, and wherein the DC/AC inverter is connected to each module. Furthermore, in this example, the solar modules are parallelly interconnected.

FIG. 13*c* is a schematic illustration of an example solar array system 904 having for example parallelly connected solar-array panels 506/508/509/511, wherein each of the solar-array panels 506/508/509/511 provides DC voltage to a serially coupled inverter 950 that invert the DC voltage to AC voltage. The solar-array panels 506/508/509/511 are connected in parallel both before the DC voltage of each one is inverted to AC voltage, and after the DC voltage of each one is inverted to AC voltage.

Figure 13D:
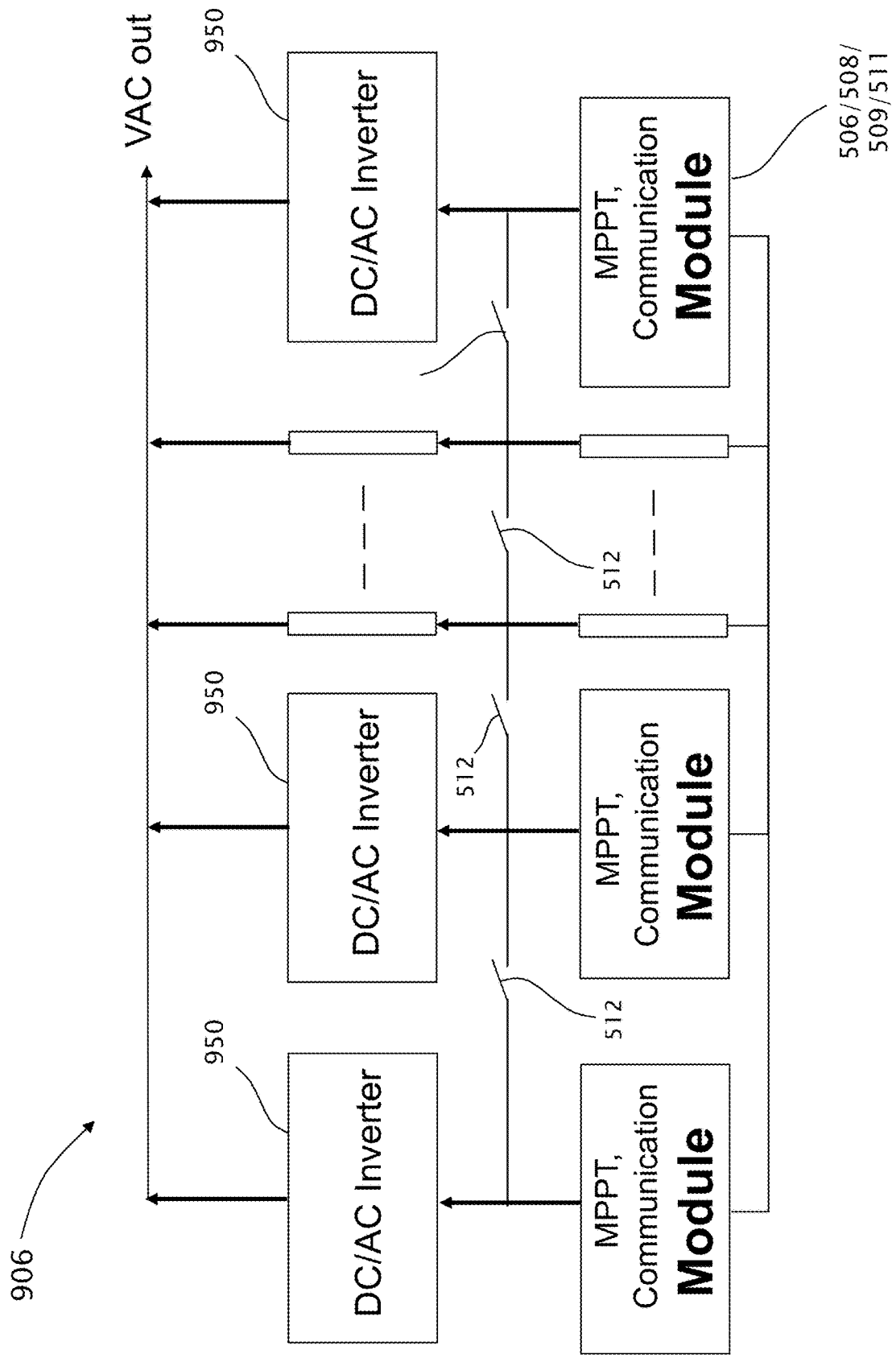
FIG. 13d is a schematic illustration showing an example solar-array system, having for example "n" solar modules when each one consists of a solar panel equipped by MPPT optimizer and communication device, wherein each panel includes a crisscross matrix of PV sub solar cells, and wherein the DC/AC inverter connects to each module. Furthermore, in this example, the solar modules are parallelly interconnected, wherein the connections in the parallel DC inputs are controllably switchable, according to embodiments of the present invention.

FIG. 13*d* is a schematic illustration of an example solar array system 906 having, for example, parallelly connected solar-array panels 506/508/509/511, wherein each of the solar-array panels 506/508/509/511 provides DC voltage to a serially coupled inverter 950 that invert the DC voltage to AC voltage. The solar-array panels 506/508/509/511 are connected in parallel both before the DC voltage of each one is inverted to AC voltage, and after the DC voltage of each one is inverted to AC voltage. However, differing from solar array system 904, each of the parallel connections of solar-array panels 506/508/509/511 that are connected in parallel both before the DC voltage of each one is inverted to AC voltage, is switchable by a switch 512, typically, a controllable switch.

Figure 14:
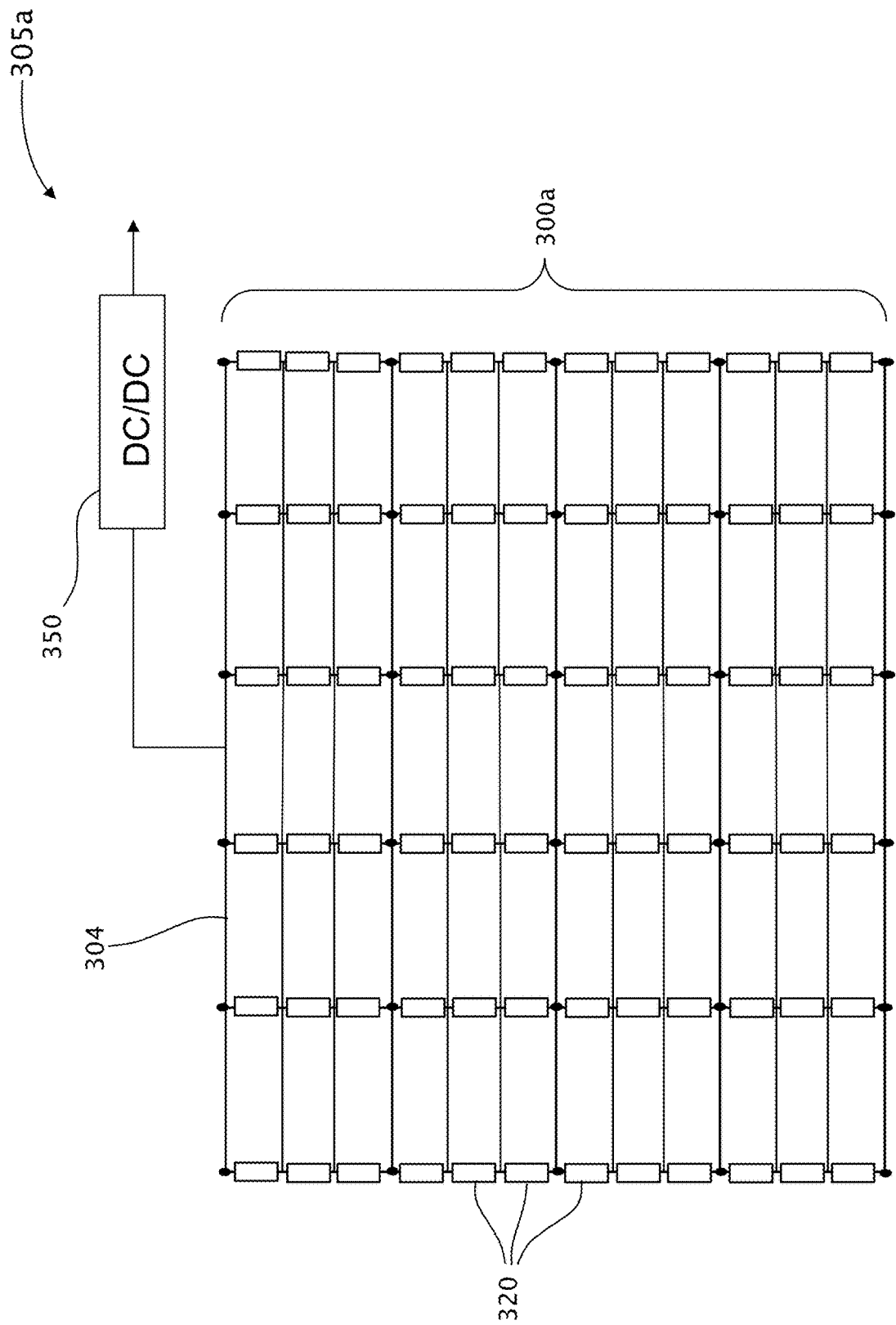
FIG. 14 is a schematic illustration of an example solar cell module, wherein a DC to DC voltage converter is connected to the output of the solar cell matrix shown in FIG. 5b, according to some embodiments of the present invention.
Figure 15:
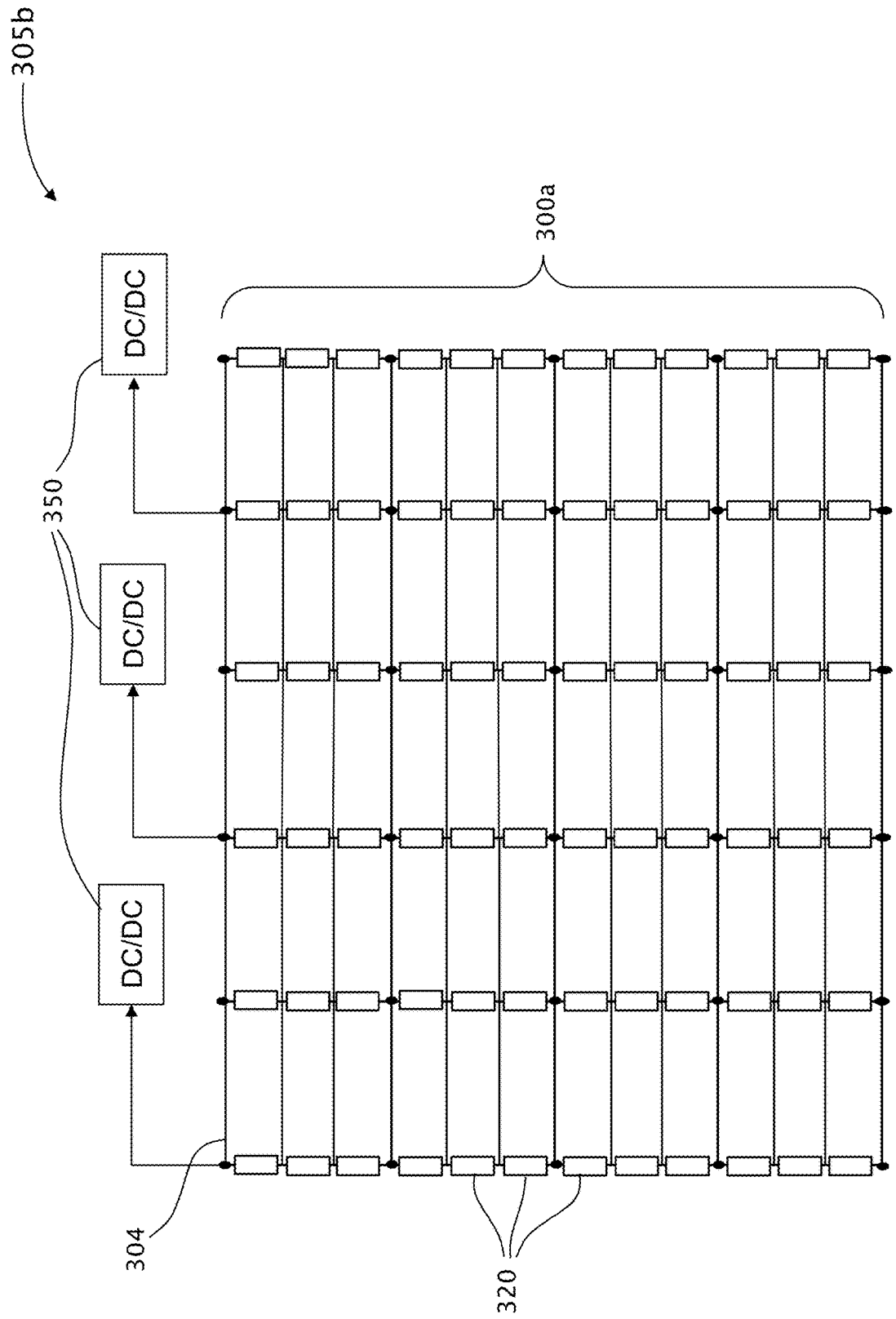
FIG. 15 is a schematic illustration of another example solar cell module, wherein a number of DC to DC voltage converters are connected to the output of the solar cell matrix shown in FIG. 5b, according to some embodiments of the present invention.
Figure 16:
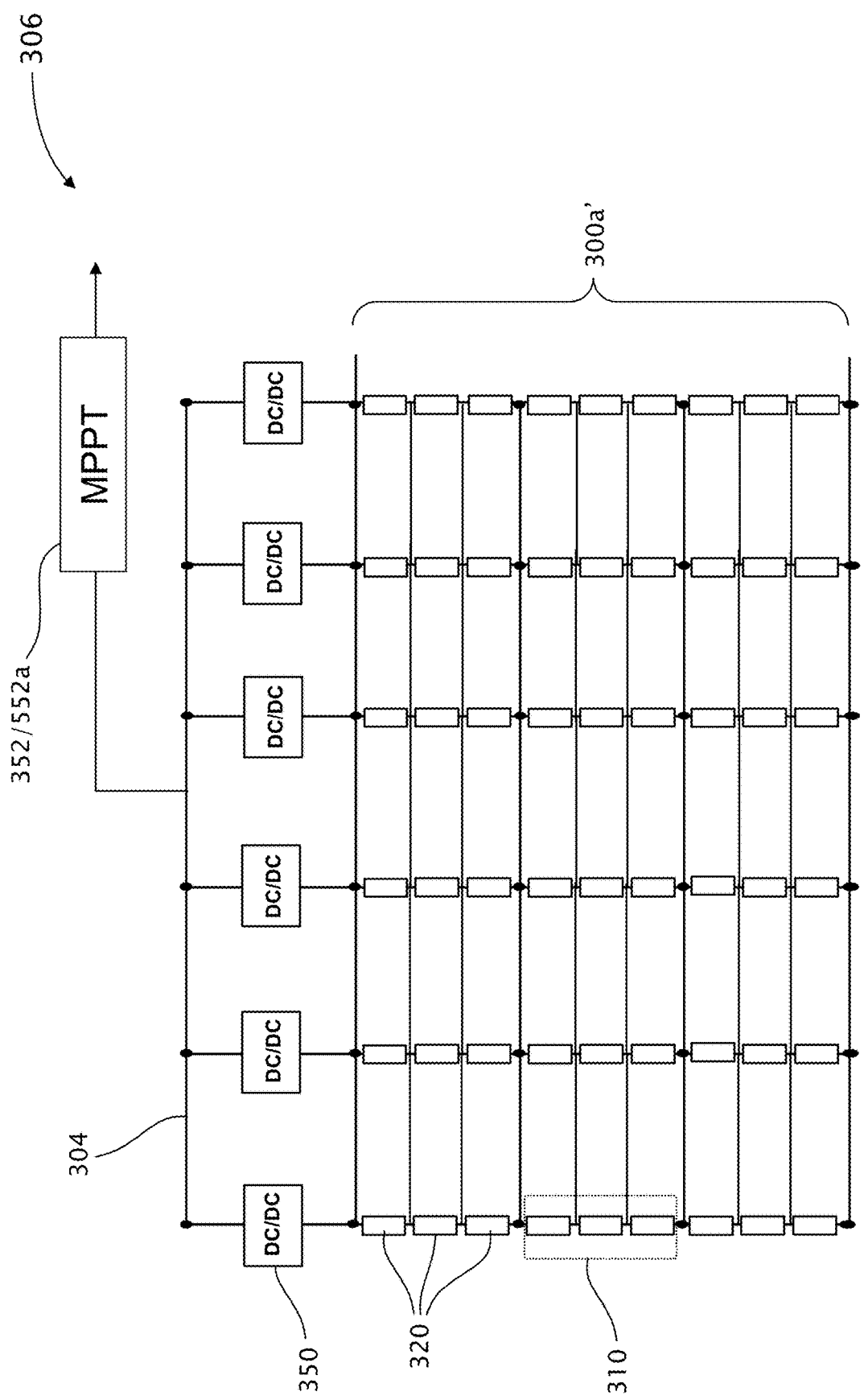
FIG. 16 is a schematic illustration of another example solar cell module, wherein a number of DC to DC voltage converters are connected to the output of the solar cell matrix, as shown in FIG. 5b, and a MPPT device is connected to the output of the above converters with paralleled outputs, according to some embodiments of the present invention.

Other variations of the present invention are shown in FIGS. 14-16. FIG. 14 is a schematic illustration of a solar cell module 305*a*, wherein a DC to DC voltage converter 350, that boost low panel voltage to desirable panel output voltage level or for MPP regulation, is connected to the output of solar cell matrix 300, according to embodiments of the present invention; FIG. 15 is a schematic illustration of another solar cell module 305*b*, wherein a number of DC to DC voltage converters 350, that boosts low panel voltage to desirable panel output voltage level or for MPP regulation, is connected to the output of solar cell matrix 300, according to other embodiments of the present invention. It should be noted that the DC to DC voltage converter 350 may be a Push-Pull converter, an UP converter, a forward converter, a maximum power point tracker (MPPT) device (352) or other types of converters, or a combination thereof.

The crisscross configuration of PV cells 310 minimizes the power losses of solar cell modules 305*a*/305*b* (305), when any PV sub cell 320 malfunctions, whereas the current generated by sub cells connected in series to the malfunctioned sub cell are not lost but rerouted to bypass the malfunctioned sub cell. Using PV sub cells 320 rather than a regular PV cell 210, substantially reduces the electrical current generated within solar cell module 305 and thereby, substantially reduces the losses of power due to conductive losses on solder points 212/312 between PV cells 320 (or 310) and external conductors 204/304; losses of power due to conductor connections between PV cells 320, on busbars on solar cells, on conductors connecting PV cells to string of cells and conductors connecting string of PV cells to Junction Box Hence, by decreasing the overall power losses of solar cell module 305, the output power of solar cell module 305 is maximized.

FIG. 16 is another schematic example of a solar cell module 306, wherein a number of DC to DC voltage converters 250/350 are connected to the output of the solar cell module 306, according to some embodiments of the present invention. A multiplicity of other combinations of PV solar cells 210 and/or PV sub cells 310/320 may be configured to a variety of other solar cell modules, all of which are within the scope of the present invention.

Figure 17:
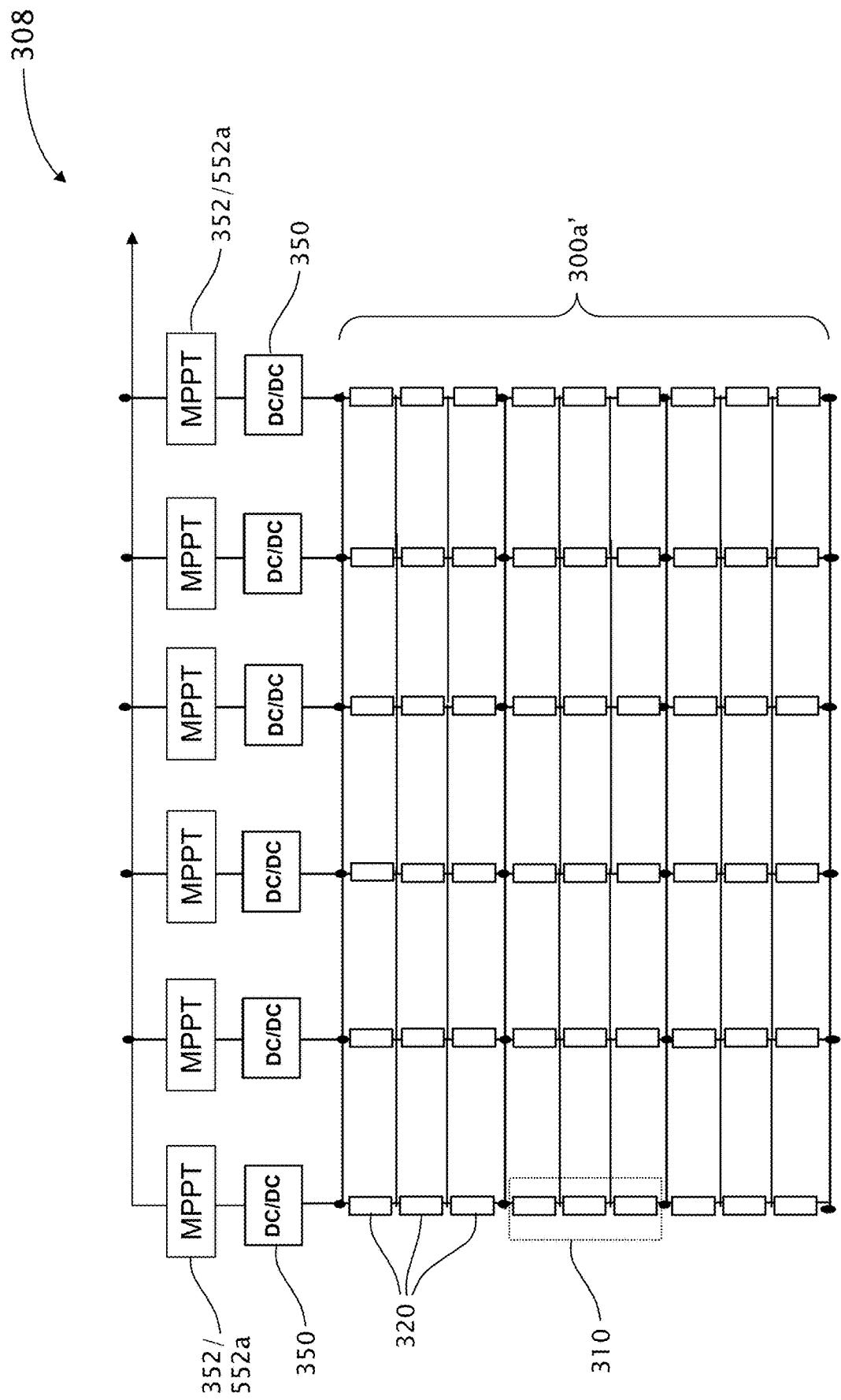
FIG. 17 is a schematic illustration of another example solar cell module, wherein a number of DC to DC voltage converters are connected to the output of the solar cell matrix, as shown in FIG. 5b, and a number of MPPT devices are connected to output each one of the above converters and the outputs of MPPT devices are paralleled, according to some embodiments of the present invention.

FIG. 17 is a schematic illustration of another example of a solar cell module 308, wherein a number of DC to DC voltage converters 350 are connected to the output of the solar cell matrix, as shown in FIG. 4*a*, and number of MPPT devices 352 are connected to output of each one of above converters and the outputs of MPPT devices 352 are paralleled, according to some embodiments of the present invention.

The present invention being thus described in terms of several embodiments and examples, it will be appreciated that the same may be varied in many ways. Such variations are not to be regarded as a departure from the spirit and scope of the invention, and all such modifications as would be obvious to one skilled in the art are contemplated.

What is claimed is:

1. A solar power generation system for providing a predetermined operating power level and predetermined operating voltage level requirement, the system comprising:
   at least one solar-array panel;
   wherein each of said solar-array panels includes a multiplicity of photovoltaic (PV) solar sub cells and does not include a DC/DC converter;
   wherein a preconfigured number of said PV solar sub cells are electrically connected in series to form strings of PV solar sub cells, wherein the strings of PV solar sub cells are facilitated to produce a first DC output voltage level;
   wherein a preconfigured number of said strings of PV solar sub cells are electrically connected in parallel to form an array of said PV solar sub cells, wherein said array of said PV solar sub cells is facilitated to produce a first output power level;
   wherein in each of said strings of PV solar sub cells, each of said PV solar sub cells is also connected in parallel to neighboring PV solar sub cells of all other strings of PV solar sub cells, to form a crisscross matrix configuration of said array of said PV solar sub cells;
   wherein said crisscross matrix array of said PV solar sub cells allows currents to bypass malfunctioning PV solar sub cells, thereby improving the performance of the system;
   wherein each of said PV solar sub cells is physically smaller than a regular PV solar cell, wherein a regular PV solar cell is substantially quadrangular of at least 8 cm×8 cm, and wherein said PV solar sub cell is a substantially quadrangular PV solar cell that is 1.5 cm×8 cm.

2. The solar power generation system of claim 1, wherein each of said strings of PV solar sub cells includes the same number of said PV solar sub cells that are electrically connected in series.

3. The solar power generation system of claim 1, further comprising:
a quantity of bypass diodes to a preconfigured number of rows of said PV solar sub cells of said crisscross matrix of said array of said solar-array panel.

4. The solar power generation system of claim 1, wherein multiple said solar-array panels are connected in parallel and coupled to operate with a panel DC/AC inverter, to invert the first DC output voltage of said solar-array panels to AC voltage.

5. The solar power generation system of in claim 4, wherein said array of parallelly-connected solar-array panels are further connected in serial with a battery charger, and wherein said battery charger is optionally coupled to operate with a maximum power point tracker (MPPT) optimizer.

6. The solar power generation system of in claim 1, wherein multiple said solar-array panels are serially connected to form a string of solar-array panels, wherein said multiple strings of solar-array panels are connected in parallel; and
wherein said array of multiple strings of solar-array panels that are connected in parallel is further serially connected with a DC to AC inverter.

7. The solar power generation system of claim 6, wherein each of said strings of solar-array panels is serially connected with a DC to AC inverter, before being parallelly interconnected.

8. The solar power generation system of claim 1, wherein the first DC output of said crisscross matrix of said array of said PV solar sub cells is regulated by a MPPT optimizer, to maximize the power yield of said solar-array panel of the solar power generation system.

9. The solar power generation system of claim 8, further comprising:
a communication unit facilitating communication between said MPPT optimizer; and
a remote computerized unit.

10. The solar power generation system of claim 9, wherein the first DC output of said crisscross matrix array is serially connected to an inverter that inverts the DC voltage to AC voltage.

11. The solar power generation system of claim 9, wherein multiple said solar-array panels, that are MPP regulated, are serially connected to form a string of solar-array panels, and wherein said multiple strings of solar-array panels are connected in parallel.

12. The solar power generation system of claim 9, wherein multiple said solar-array panels, that are MPP regulated, are connected in parallel.

13. The solar power generation system of claim 12, wherein each of said solar-array panels is serially connected with a DC to AC inverter, before being interconnected in parallel.

14. The solar power generation system of claim 13, wherein each of said solar-array panels is serially connected with to a DC to AC inverter, and
wherein said solar-array panels are connected in parallel before being serially connected with said DC to AC inverter and after being serially connected with said DC to AC inverter.

15. The solar power generation system of claim 13, wherein each of said solar-array panels is serially connected with a DC to AC inverter, and wherein said parallel connection of said solar array panels before being serially connected with DC to AC inverter is switchable.

16. The solar power generation system of claim 1, wherein the first DC output of each of said parallelly-connected strings of PV solar sub cells of said crisscross matrix array is serially connected to a DC/DC power converter; and
wherein said parallel-connected DC/DC power converters are serially connected to a single MPPT or to a respective MDPT.

* * * * *